US012764951B2

(12) United States Patent
Huang et al.

(10) Patent No.: US 12,764,951 B2
(45) Date of Patent: Oct. 13, 2026

(54) SEMICONDUCTOR DEVICE INCLUDING A MULTIPLE-TIME PROGRAMMABLE MEMORY CELL

(71) Applicant: Taiwan Semiconductor Manufacturing Company, Ltd., Hsinchu (TW)

(72) Inventors: Chen-Ming Huang, Tainan City (TW); Shih-Hsien Chen, Zhubei City (TW); Yu-Hsiang Yang, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 371 days.

(21) Appl. No.: 18/430,321

(22) Filed: Feb. 1, 2024

(65) Prior Publication Data

US 2025/0126781 A1 Apr. 17, 2025

Related U.S. Application Data

(60) Provisional application No. 63/589,460, filed on Oct. 11, 2023.

(51) Int. Cl.
*H10B 41/35* (2023.01)

(52) U.S. Cl.
CPC .................................... *H10B 41/35* (2023.02)

(58) Field of Classification Search
None
See application file for complete search history.

(56) References Cited

U.S. PATENT DOCUMENTS

2017/0011804 A1* 1/2017 La Rosa ................ G11C 16/26
2022/0336482 A1* 10/2022 Chen ...................... H10B 41/10

* cited by examiner

*Primary Examiner* — J. E. Schoenholtz
(74) *Attorney, Agent, or Firm* — Harrity & Harrity, LLP

(57) ABSTRACT

A semiconductor device includes a non-volatile memory structure. A layout of metallization layers in the semiconductor device coupled with the non-volatile memory structure is configured to achieve a low likelihood of electromigration in the non-volatile memory structure, particularly at operating temperature parameters associated with demanding applications such as automotive and/or industrial, among other examples. The non-volatile memory structure is electrically coupled with a first metallization layer. The first metallization layer electrically couples the non-volatile memory structure with a second metallization layer that is configured as a write bit line metallization layer for the non-volatile memory structure. The first metallization layer electrically couples the non-volatile memory structure with a third metallization layer above the second metallization layer. The third metallization layer is configured as a read bit line metallization layer for the non-volatile memory structure.

20 Claims, 20 Drawing Sheets

300

| | $V_{SG}$ | $V_{WL}$ | $V_{EL}$ | $V_{BL\_W}$ | $V_{BL\_R}$ | $V_{SL}$ | $V_{BULK}$ |
|---|---|---|---|---|---|---|---|
| 302 | 0 | 0 | HV | 0 | 0 | 0 | 0 |
| 304 | 0 | HV | HV | 0 | ~HV/2 | 0 | 0 |
| 306 | ~3.0-6.0 | ~0.5-2.0 | 0 | 0 | ~0.5-2.0 | 0 | 0 |

FIG. 3

SEMICONDUCTOR DEVICE INCLUDING A MULTIPLE-TIME PROGRAMMABLE MEMORY CELL

CROSS-REFERENCE TO RELATED APPLICATION

This patent application claims priority to U.S. Provisional Patent Application No. 63/589,460, filed on Oct. 11, 2023, and entitled "MEMORY DEVICE INCLUDING MULTIPLE-TIME PROGRAMMABLE MEMORY CELLS." The disclosure of the prior application is considered part of and is incorporated by reference into this patent application.

BACKGROUND

Many electronic devices include a memory device that is configured to store electronic data. A memory device may include one or more volatile memory cells and/or one or more non-volatile memory cells. Volatile memory cells store electronic data only while powered, while non-volatile memory cells are capable of retaining stored electronic data even after power is removed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a diagram of an example implementation of voltage parameters for operation of the non-volatile memory cell described herein.

DETAILED DESCRIPTION

Figure 1:
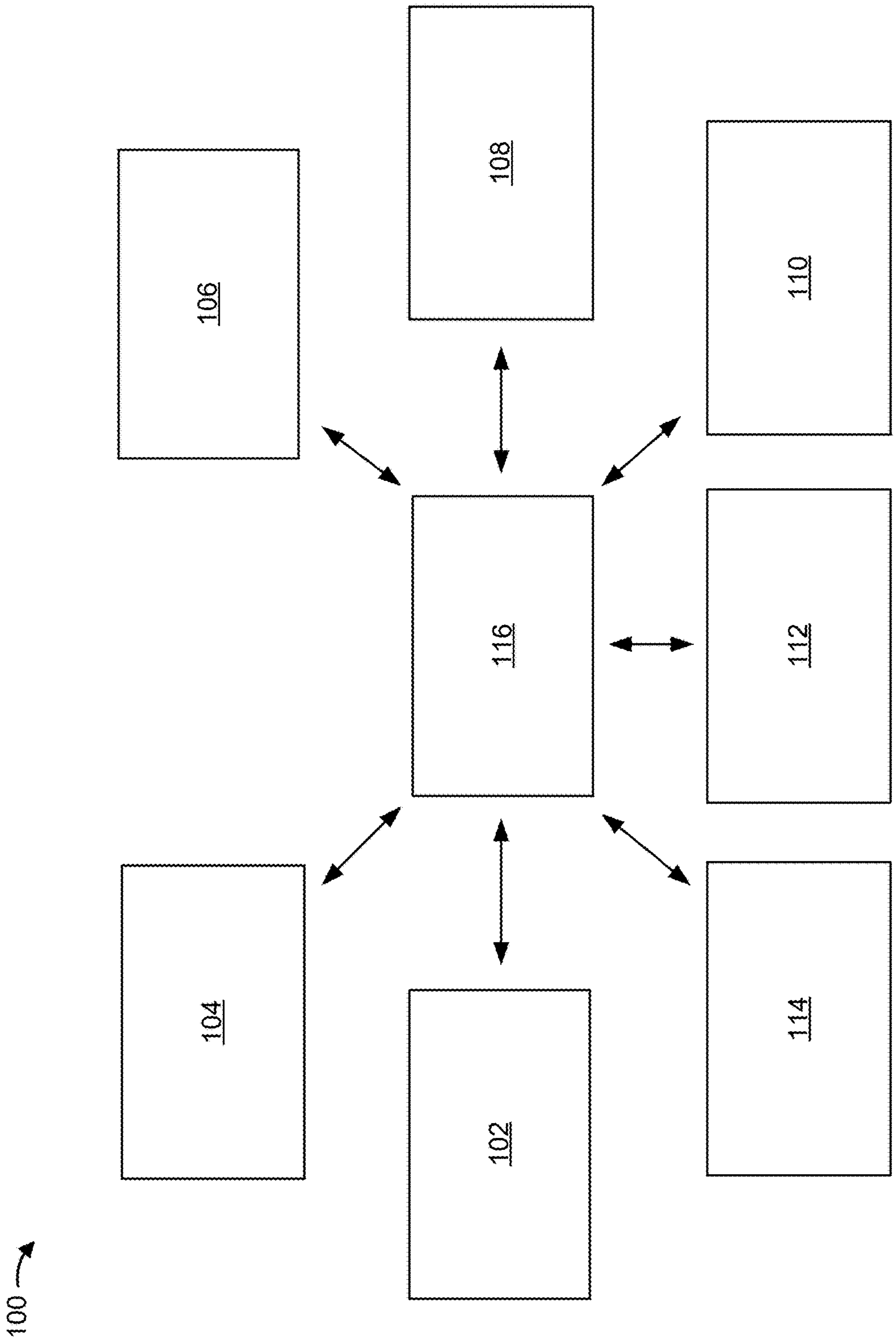
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A multiple-time programmable (MTP) memory cell is a type of non-volatile memory cell that can be programmed and erased multiple times as opposed to a one-time programmable (OTP) non-volatile memory cell that can be programmed only once. Examples of MTP memory cells include a FLASH memory cell, resistive random access memory (RRAM) cell, a ferroelectric random access memory (FeRAM) cell, and/or a phase change random access memory (PC-RAM) cell, among other examples. MTP memory cells are capable of being integrated with logic complementary metal-oxide-semiconductor (CMOS) processes, including bipolar CMOS double-diffused metal-oxide-semiconductor (DMOS) (BCD) technology and/or high voltage (HV) CMOS technology. Among other things, integrating the MTP memory cells with HV technology and/or BCD technology enables non-volatile memory to be used in applications such as Internet of things (IoT), power management, smart cards, microcontroller units (MCUs), display controllers, and/or automotive devices, among other examples.

Some applications for MTP memory cells have environmental parameters that are more demanding than other applications. For example, automotive and industrial applications typically call for higher operating temperatures at which an MTP memory cell is to operate than for other applications such as consumer applications. Thus, an MTP memory cell that is designed for use in a consumer application may not be able to withstand the high temperatures in an automotive application. Electromigration may occur in the MTP memory cell at high operating temperatures, such as in a range of approximately 85 degrees Celsius to approximately 175 degrees Celsius or greater. Electromigration may result in short circuiting and/or open circuiting in the MTP memory cell, which can lead to a reduced operating life of the MTP memory cell and/or failure of the MTP memory cell, among other examples.

In some implementations described herein, a semiconductor device includes a non-volatile memory structure such as an MTP memory cell. A layout of metallization layers of the semiconductor device coupled with the non-volatile memory structure is configured to achieve a low likelihood of electromigration in the non-volatile memory structure, particularly at operating temperature parameters associated with demanding applications such as automotive and/or industrial, among other examples. The non-volatile memory structure is electrically coupled with a first metallization layer (e.g., an M1 layer). The first metallization layer electrically couples the non-volatile memory structure with a second metallization layer (e.g., an M2 layer) that is configured as a write bit line (BL_W) for the non-volatile memory structure. The first metallization layer electrically couples the non-volatile memory structure with a third metallization layer (e.g., an M3 layer) above the second metallization layer. The third metallization layer is configured as a read bit line (BL_R) for the non-volatile memory structure.

Including the read bit line in the third metallization layer reduces the likelihood and/or amount of electromigration in the non-volatile memory structure. The metallization layers coupled with the non-volatile memory structure are arranged in order of increasing size, such that a top view width of the second metallization layer is greater than a top view width of the first metallization layer, and a top view width of the third metallization layer is greater than the top view width of the second metallization layer. The greater top view width of the third metallization layer enables the third metallization layer to better handle a cell read current of the non-volatile memory structure (which is greater than a cell write current of the non-volatile memory structure) than the second metallization layer. In particular, the greater top view width of the third metallization layer enables the third metallization layer to withstand electromigration at greater operating currents because of the greater heat dissipation in the third metallization layer than in the second metallization layer. Thus, at high operating temperatures, such as in an automotive or industrial application, the greater top view width of the third metallization layer provides a lesser likelihood of electromigration in the read bit line of the non-volatile memory structure than if the second metallization layer were to be used as the read bit line. This reduces the likelihood of short circuiting and/or open circuiting in the non-volatile memory structure, which may increase the operating life of the non-volatile memory structure and/or reduce the likelihood of failure of the non-volatile memory structure at high operating temperatures without expanding the footprint of non-volatile memory structure.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or a semiconductor manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma enhanced CVD (PECVD) tool, a low-pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of different types of deposition tools 102. "Deposition tool 102," as used herein, may refer to one or more deposition tools 102, one or more of the same type of deposition tools 102, and/or one or more different types of deposition tools 102, among other examples.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-114 may perform one or more semiconductor processing operations described herein. For example, one or more of the semiconductor processing tools 102-114 may be used to form a doped region in a substrate of a semiconductor device; form, above the doped region, a first gate structure of a first transistor structure of a memory structure; form, above the doped region, a second gate structure of a second transistor structure of the memory structure; form, in the doped region, a first source/drain region adjacent to the first gate structure; form, in the doped region, a second source/drain region adjacent to the second gate structure; form a first metallization layer above the first source/drain region and the second source/drain region; form, above the first source/drain region, a write bit line metallization layer coupled with the first metallization layer; and/or form, above the second source/drain region and above the write bit line metallization layer, a read bit line metallization layer coupled with the first metallization layer, among other examples. One or more of the semiconductor processing tools 102-114 may perform other semiconductor processing operations described herein, such as in connection with FIGS. 6A-6F, 7A-7E, and/or 8, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
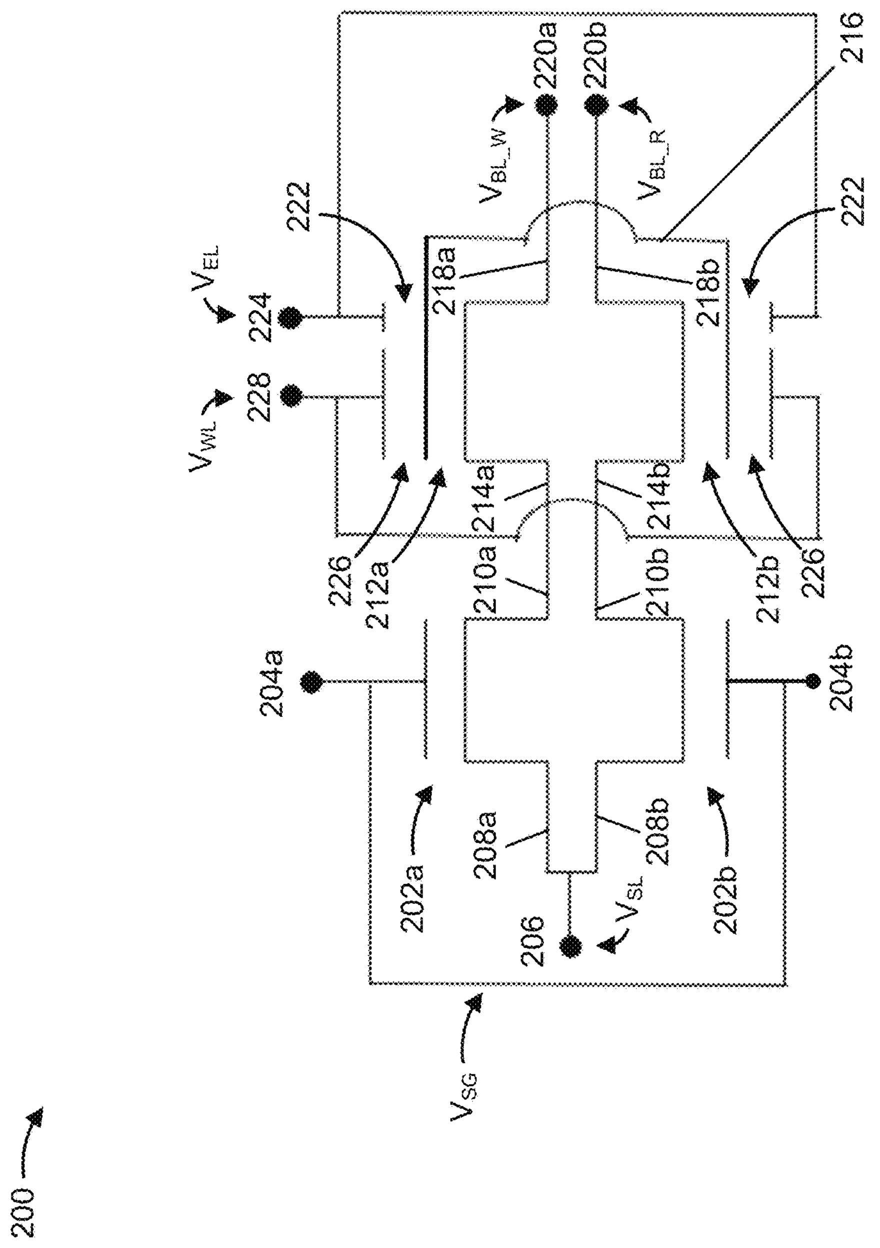
FIG. 2 is a circuit diagram of an example non-volatile memory cell described herein.

FIG. 2 is a circuit diagram of an example non-volatile memory cell 200 described herein. The non-volatile memory cell 200 is an MTP memory cell that includes a plurality of transistors and a plurality of capacitors. While the example in FIG. 2 includes a 4 transistor 2 capacitor (4T2C) non-volatile memory cell 200, the non-volatile memory cell 200 may include other quantities of transistors and/or capacitors. Additionally and/or alternatively, the non-volatile memory cell 200 may include another type of MTP memory cell, such as a FLASH memory cell, an RRAM cell, an FeRAM cell, a PC-RAM cell, and/or another type of non-volatile memory cell.

As shown in FIG. 2, the non-volatile memory cell 200 may include a plurality of select transistors, including a select transistor 202*a* and a select transistor 202*b*. The select transistor 202*a* includes a select gate 204*a*, and the select transistor 202*b* includes a select gate 204*b*. The select gates 204*a* and 204*b* are electrically coupled such that a select gate voltage ($V_{SG}$) may be applied to both of the select gates 204*a* and 204*b*.

A select source/drain 208*a* of the select transistor 202*a* and a select source/drain 208*b* of the select transistor 202*b* are also electrically coupled together and to a source line 206. This enables a source line voltage ($V_{SL}$) to be applied to the select source/drains 208*a* and 208*b* through the source line 206 to select the non-volatile memory cell 200 among other non-volatile memory cells in a memory cell array in which the non-volatile memory cell 200 is included. "Source/drain" may refer to a source or a drain, individually or collectively dependent upon the context.

Another select source/drain 210*a* of the select transistor 202*a*, and another select source/drain 210*b* of the select transistor 202*b*, are electrically coupled with a storage transistor 212*a* and a storage transistor 212*b*, respectively. In particular, the select source/drain 210*a* of the select transistor 202*a* is electrically coupled with a storage source/drain 214*a* of the storage transistor 212*a*, and the select source/drain 210*b* of the select transistor 202*b* is electrically coupled with a storage source/drain 214*b* of the storage transistor 212*b*.

The storage transistors 212*a* and 212*b* may be selectively activated and/or deactivated by a floating gate 216. The floating gate 216 of the non-volatile memory cell 200 includes sections for each of the storage transistors 212*a* and 212*b*. A storage source/drain 218*a* of the storage transistor 212*a* is electrically coupled with a write bit line 220*a*, and a storage source/drain 218*b* of the storage transistor 212*b* is directly electrically coupled to a read bit line 220*b*. A write bit line voltage ($V_{BL\_W}$) may be applied to the storage transistor 212*a* through the write bit line 220*a*, and a read bit line voltage ($V_{BL\_R}$) may be applied to the storage transistor 212*b* through the read bit line 220*b*.

The storage transistors 212*a* and 212*b* enable data to be stored in the non-volatile memory cell 200. In particular, the storage transistors 212*a* and 212*b* control access to an erase line capacitor 222 that is included between the floating gate 216 and an erase line 224, and to a word line capacitor 226 that is included between the floating gate 216 and a word line 228. In some implementations, a first electrode of the erase line capacitor 222 may correspond to first doped regions of a substrate (e.g., a first capacitor active region and/or a first well region) of a semiconductor device, and a second electrode of the erase line capacitor 222 may correspond to the floating gate 216. In some implementations, the erase line capacitor 222 is configured as a tunneling capacitor. An erase line voltage ($V_{EL}$) may be applied to the first electrode of the erase line capacitor 222.

In some implementations, a first electrode of the word line capacitor 226 may correspond to second doped regions of a substrate (e.g., a second capacitor active region and/or a second well region) of a semiconductor device, and a second electrode of the word line capacitor 226 may be defined by the floating gate 216. In some embodiments, the word line capacitor is configured as a coupling capacitor. A word line voltage ($V_{WL}$) may be applied to the first electrode of the word line capacitor 226.

As indicated above, FIG. 2 is provided as an example. Other examples may differ from what is described with regard to FIG. 2.

FIG. 3 is a diagram of an example implementation 300 of voltage parameters for operation of the non-volatile memory cell 200 described herein. For example, the example implementation 300 of voltage parameters includes voltage parameters for an erase operation 302 of the non-volatile memory cell 200, a program (or write) operation 304 of the non-volatile memory cell 200, and a read operation 306 of the non-volatile memory cell 200.

For an erase operation 302, the select gate voltage ($V_{SG}$) of approximately 0 volts (V) is applied to the select gates 204*a* and 204*b* respectively of the select transistors 202*a* and 202*b*. A word line voltage ($V_{WL}$) of approximately 0 V may be applied to the storage transistors 212*a* and 212*b* through the word line 228. An erase line voltage ($V_{EL}$) may be set to a high voltage (HV) and may be applied to the storage transistors 212*a* and 212*b* through the erase line 224. In some implementations, the HV is included in a range of approximately 7 V to approximately 10 V. In some implementations, the HV is included in a range of approximately 11 V to 18 V. In some implementations, the HV is included in a range of approximately 7 V to 18 V. However, other values and/or ranges for the HV are within the scope of the present disclosure. A write bit line voltage ($V_{BL\_W}$) of approximately 0 V may be applied to the storage source/drain 218*a* of the storage transistor 212*a* through the write bit line 220*a*. A read bit line voltage ($V_{BL\_R}$) of approximately 0 V and may be applied to the storage source/drain 218*b* of the storage transistor 212*b* through the read bit line 220*b*. A source line voltage ($V_{SL}$) of approximately 0 V and may be applied to the select source/drain 208*a* and 208*b* of the select transistors 202*a* and 202*b*, respectively. In some embodiments, a bulk substrate voltage ($V_{BULK}$) of approximately 0 V and may be applied to a bulk region of a substrate of a semiconductor device in which the non-volatile memory cell 200 is included.

The above-described operating voltages enable the erase operation 302 to be performed. A voltage at the erase line capacitor 222 is sufficiently high such that charge carriers (e.g., electrons) are discharged from the floating gate 216 by tunneling to the first electrode of the erase line capacitor 222. This in part erases a data state of the floating gate 216 such that the floating gate 216 is in a high resistance state.

For a program operation 304, a select gate voltage ($V_{SG}$) of approximately 0 V may be applied to the select gates 204*a* and 204*b* of the select transistors 202*a* and 202*b*, respectively. A word line voltage ($V_{WL}$) may be set to the HV and may be applied to the storage transistors 212*a* and 212*b* through the word line 228. An erase line voltage ($V_{EL}$) may also be set to the HV and may be applied to the storage transistors 212*a* and 212*b* through the erase line 224. A write bit line voltage ($V_{BL\_W}$) of approximately about 0 V may be applied to the storage source/drain 218*a* of the storage transistor 212*a*, and a read bit line voltage ($V_{BL\_R}$) of approximately half of the HV (e.g., approximately HV/2) may be applied to the storage source/drain 218*b* of the storage transistor 212*b*. The source line voltage ($V_{SL}$) of approximately 0 V may be applied to the select source/drains 208*a* and 208*b* of the select transistors 202*a* and 202*b*, respectively. In some implementations, a bulk substrate voltage ($V_{BULK}$) of approximately 0 V may be applied to a bulk region of the substrate.

The above-described operating voltages enable a cell write current to be applied to the non-volatile memory cell 200 in the program operation 304. The HV being applied to the erase line capacitor 222 and the word line capacitor 226, and 0 V being applied to the write bit line 220*a*, results in an inverse of the erase operation 302. This causes charge carriers (e.g., electrons) to be injected from the storage source/drain 218*a* of the storage transistor 212*a* by tunneling into the floating gate 216. This programs a data state of the floating gate 216 such that the floating gate 216 is in a low resistance state. Additionally and/or alternatively, channel hot electrode (CHE) injection is utilized to program the floating gate 216.

For a read operation 306, a select gate voltage ($V_{SG}$) of approximately 3.0 volts to approximately 6.0 volts may be applied to the select gates 204*a* and 204*b* of the select transistors 202*a* and 202*b*, respectively. However, other values for the select gate voltage are within the scope of the present disclosure. A word line voltage ($V_{WL}$) of approximately 0.5 volts to approximately 2.0 volts may be applied to the storage transistors 212*a* and 212*b* through the word line 228. However, other values for the word line voltage are within the scope of the present disclosure. An erase line voltage ($V_{EL}$) of approximately 0 V may be applied to the storage transistors 212*a* and 212*b* through the erase line 224. A write bit line voltage ($V_{BL\_W}$) is approximately 0 V and may be applied to the storage source/drain 218*a* of the storage transistor 212*a* through the write bit line 220*a*. A read bit line voltage ($V_{BL\_R}$) of approximately 0.5 volts to approximately 2.0 volts may be applied to the storage source/drain 218*b* of the storage transistor 212*b* through the read bit line 220*b*. In some implementations, a bulk substrate voltage ($V_{BULK}$) is about 0 V and may be applied to a bulk region of the substrate.

The above-described operating voltages enable the read operation 306 to be performed. In particular, a cell read current is to be applied to the non-volatile memory cell 200 in the read operation. This enables a data state of the floating gate 216 to be read at the source line 206 in the read operation 306. The magnitude of the cell read current may be greater than the magnitude of the cell write current for the non-volatile memory cell 200.

As indicated above, FIG. 3 is provided as an example. Other examples may differ from what is described with regard to FIG. 3.

Figure 4A:
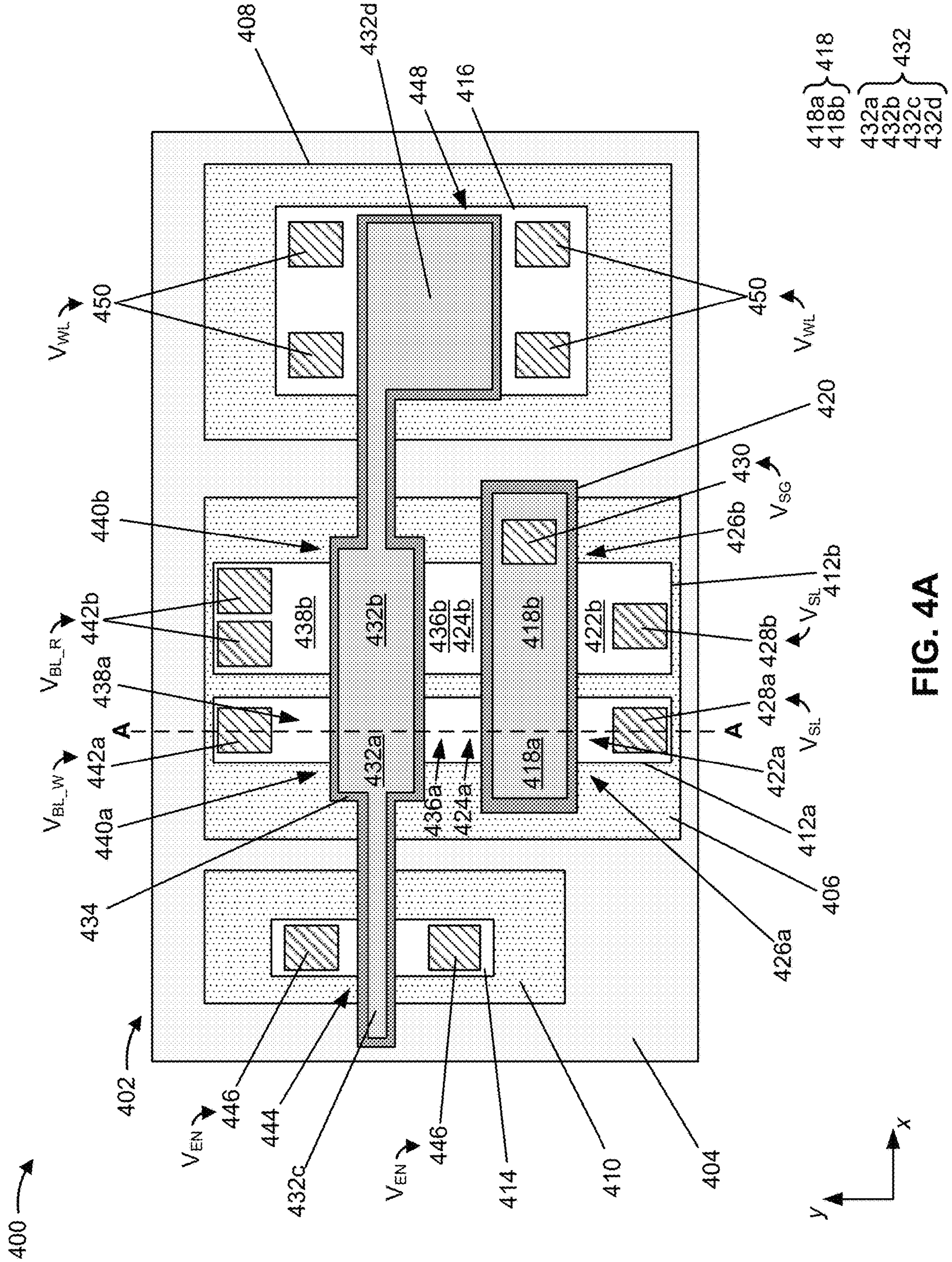
FIGS. 4A and 4B are diagrams of an example memory structure described herein.
Figure 4B:
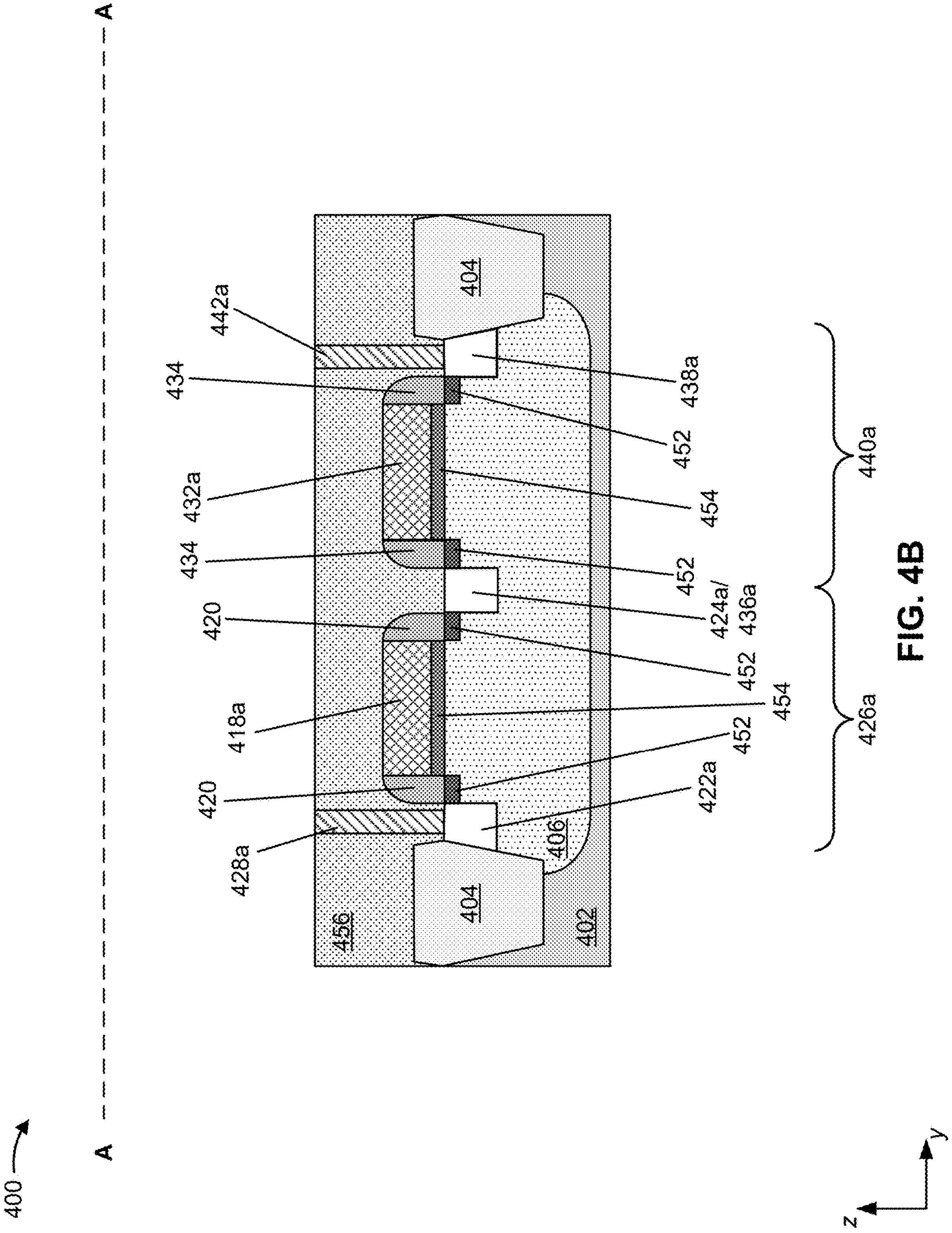

FIGS. 4A and 4B are diagrams of an example memory structure 400 described herein. The memory structure 400 may include a non-volatile memory structure and may be a physical implementation of the non-volatile memory cell 200 described in connection with FIG. 2.

FIG. 4A is a top-down view of the memory structure 400. As shown in FIG. 4A, the memory structure 400 includes a substrate 402 and an isolation structure 404 in the substrate 402. A plurality of well regions 406-410 are included in the substrate 402 within openings of the isolation structure 404. The doped regions 406-410 are laterally offset in a y-direction in the memory structure 400 from one another by a non-zero distance such that the well regions 406-410 are separate from one another.

The substrate 402 may include a bulk semiconductor substrate (e.g., a bulk silicon (Si) substrate), a silicon-on-insulator (SOI) substrate, or another suitable substrate material, and/or may include a first doping type (e.g., p-type). The isolation structure 404 includes a shallow trench isolation (STI) structure, a deep trench isolation (DTI) structure, and/or another type of isolation structure that electrically isolates the well regions 406-410 from one another. The isolation structure 404 may include one or more dielectric materials, such as a silicon oxide ($SiO_x$ such as $SiO_2$), a silicon nitride ($Si_xN_y$ such as $Si_3N_4$), a silicon oxynitride (SiON), a silicon carbon nitride (SiCN), a silicon oxycarbonitride (SiOCN), and/or another suitable dielectric material.

The well regions 406-410 may each include a doped region of the substrate 402. For example, the well region 406 may include the first doping type (e.g., p-type) with a higher doping concentration than the substrate 402. As another example, the well region 408 may include a second doping type (e.g., n-type). As another example, the well region 410 may include the second doping type (e.g., n-type). Examples of p-type dopants include boron (B), gallium (Ga), and/or indium (In), among other examples. Examples of n-type dopants include arsenic (As) and/or phosphorous (P), among other examples.

As further shown in FIG. 4A, active regions may be included in the well regions 406-410. For example, a write bit line active region 412*a* and a read bit line active region 412*b* may each be included in the well region 406. The write bit line active region 412*a* and the read bit line active region 412*b* may each extend in the y-direction in the memory structure 400 and may be adjacent in the well region 406 in the x-direction in the memory structure 400. As another example, an erase line capacitor active region 414 is included in the well region 410. As another example, a word line capacitor active region 416 is included in the well region 408.

The write bit line active region 412*a* and the read bit line active region 412*b* may each include one or more materials that are doped with the second doping type (e.g., n-type). Thus, the write bit line active region 412*a* and the read bit line active region 412*b* include a doping type opposite the well region 406. This enables depletion regions to be formed around the write bit line active region 412*a* and the read bit line active region 412*b*, thereby facilitating electrical isolation between the write bit line active region 412*a* and the read bit line active region 412*b*. Examples of materials for the write bit line active region 412*a*, the read bit line active region 412*b*, the erase line capacitor active region 414, and the word line capacitor active region 416 include silicon (Si), germanium (Ge), another semiconductor material, one or more electrically conductive metals, and/or another suitable material.

A select gate structure 418*a* and a select gate structure 418*b* may extend in the x-direction in the memory structure 400. The select gate structure 418*a* is included over the write bit line active region 412*a*, and the select gate structure 418*b* is included over the read bit line active region 412*b*. The select gate structure 418*a* may correspond to the select gate 204*a* of the select transistor 202*a* of the non-volatile memory cell 200, and the select gate structure 418*b* may correspond to the select gate 204*b* of the select transistor 202*b* of the non-volatile memory cell 200. The select gate structure 418*a* and the select gate structure 418*b* may be formed as a singular select gate structure 418, and may include a polysilicon gate structure, a metal gate structure with one or more high dielectric constant (high-k) liners, and/or another type of gate structure. In implementations in which the select gate structure 418*a* and/or the select gate structure 418*b* includes a metal gate structure, the metal gate structure may include one or more electrically conductive metals, such as copper (Cu), tungsten (W), cobalt (Co), ruthenium (Ru), titanium (Ti), aluminum (Al), gold (Au), and/or a combination thereof, among other examples of electrically conductive materials.

A sidewall spacer 420 may be included around the select gate structure 418*a* and/or the select gate structure 418*b*. The sidewall spacer 420 may include one or more dielectric materials, such as a silicon oxide ($SiO_x$ such as $SiO_2$), a silicon nitride ($Si_xN_y$ such as $Si_3N_4$), a silicon oxy carbide (SiOC), a silicon oxycarbonitride (SiOCN), and/or another suitable dielectric material.

A select source/drain region 422*a* may be included adjacent to a first side of the select gate structure 418*a*, and a select source/drain region 422*b* may be included adjacent to a first side of the select gate structure 418*b*. "Source/drain region" may refer to a source region, a drain region, or a source and drain region, depending on the context. The select source/drain region 422*a* may correspond to the select source/drain 208*a* of the select transistor 202*a* of the non-volatile memory cell 200, and the select source/drain region 422*b* may correspond to the select source/drain 208*b* of the select transistor 202*b* of the non-volatile memory cell 200. The select source/drain region 422*a* may include a portion of the write bit line active region 412*a*, and the select source/drain region 422*b* may include a portion of the read bit line active region 412*b*.

A select source/drain region 424*a* may be included adjacent to a second side of the select gate structure 418*a* opposing the first side, and a select source/drain region 424*b* may be included adjacent to a second side of the select gate structure 418*b* opposing the first side. The select source/drain region 424*a* may correspond to the select source/drain 210*a* of the select transistor 202*a* of the non-volatile memory cell 200, and the select source/drain region 424*b* may correspond to the select source/drain 210*b* of the select transistor 202*b* of the non-volatile memory cell 200. The select source/drain region 424*a* may include a portion of the write bit line active region 412*a*, and the select source/drain region 424*b* may include a portion of the read bit line active region 412*b*.

The select gate structure 418*a* and the select source/drain regions 422*a* and 424*a* correspond to a select transistor structure 426*a* of the memory structure 400. The select transistor structure 426*a* may correspond to the select transistor 202*a* of the non-volatile memory cell 200. The select gate structure 418*b* and the select source/drain regions 422*b* and 424*b* correspond to a select transistor structure 426*b* of the memory structure 400. The select transistor structure 426*b* may correspond to the select transistor 202*b* of the non-volatile memory cell 200.

A source/drain contact 428*a* may be included above the select source/drain region 422*a* and may be electrically coupled and/or physically coupled with the select source/drain region 422*a*. The source/drain contact 428*a* electrically connects the select source/drain region 422_a_ to a select line metallization layer (not shown) corresponding to the source line 206 of the non-volatile memory cell 200. A source/drain contact 428_b_ may be included above the select source/drain region 422_b_ and may be electrically coupled and/or physically coupled with the select source/drain region 422_b_. The source/drain contact 428_b_ electrically connects the select source/drain region 422_b_ to the select line metallization layer corresponding to the source line 206 of the non-volatile memory cell 200. The source/drain contacts 428_a_ and 428_b_ enable a select line voltage ($V_{SL}$) to be applied to the select source/drain regions 422_a_, and 422_b_, respectively. The source/drain contacts 428_a_ and 428_b_ may each include a via, a plug, a pad, and/or other types of contact structure. The source/drain contacts 428_a_ and 428_b_ each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

A gate contact 430 may be included above the select gate structures 418_a_ and 418_b_. The gate contact 430 enables a select gate voltage ($V_{SG}$) to be applied to the select gate structures 418_a_ and 418_b_. The gate contact 430 includes a via, a plug, a pad, and/or another type of contact structure. The gate contact 430 includes one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

A floating gate structure 432_a_ and a floating gate structure 432_b_ may extend in the x-direction in the memory structure 400. The floating gate structure 432_a_ is included over the write bit line active region 412_a_, and the floating gate structure 432_b_ is included over the read bit line active region 412_b_. The floating gate structure 432_a_ may correspond to a portion of the floating gate 216 of the storage transistor 212_a_ of the non-volatile memory cell 200, and the floating gate structure 432_b_ may correspond to another portion of the floating gate 216 of the storage transistor 212_b_ of the non-volatile memory cell 200. Another floating gate structure 432_c_ may be included over the erase line capacitor active region 414, and another floating gate structure 432_d_ may be included over the word line capacitor active region 416. The floating gate structures 432_a_-432_d_ may be formed as a singular floating gate structure 432, and may include a polysilicon gate structure, a metal gate structure with one or more high-k liners, and/or another type of gate structure. In implementations in which the floating gate structure 432 includes a metal gate structure, the metal gate structure may include one or more electrically conductive metals, such as copper (Cu), tungsten (W), cobalt (Co), ruthenium (Ru), titanium (Ti), aluminum (Al), gold (Au), and/or a combination thereof, among other examples of electrically conductive materials.

A sidewall spacer 434 may be included around the floating gate structure 432. The sidewall spacer 434 may include one or more dielectric materials, such as a silicon oxide ($SiO_x$ such as $SiO_2$), a silicon nitride ($Si_xN_y$ such as $Si_3N_4$), a silicon oxy carbide (SiOC), a silicon oxycarbonitride (SiOCN), and/or another suitable dielectric material.

A storage source/drain region 436_a_ may be included adjacent to a first side of the floating gate structure 432_a_ and adjacent to the select source/drain region 424_a_. A storage source/drain region 436_b_ may be included adjacent to a first side of the floating gate structure 432_b_ and adjacent to the select source/drain region 424_b_. The storage source/drain region 436_a_ may correspond to the storage source/drain 214_a_ of the storage transistor 212_a_ of the non-volatile memory cell 200, and the storage source/drain region 436_b_ may correspond to the storage source/drain 214_b_ of the storage transistor 212_b_ of the non-volatile memory cell 200. The storage source/drain region 436_a_ may include a portion of the write bit line active region 412_a_, and the storage source/drain region 436_b_ may include a portion of the read bit line active region 412_b_.

A storage source/drain region 438_a_ may be included adjacent to a second side of the floating gate structure 432_a_ opposing the first side, and a storage source/drain region 438_b_ may be included adjacent to a second side of the floating gate structure 432_b_ opposing the first side. The storage source/drain region 438_a_ may correspond to the storage source/drain 218_a_ of the storage transistor 212_a_ of the non-volatile memory cell 200, and the storage source/drain region 438_b_ may correspond to the storage source/drain 218_b_ of the storage transistor 212_b_ of the non-volatile memory cell 200. The storage source/drain region 438_a_ may include a portion of the write bit line active region 412_a_, and the storage source/drain region 438_b_ may include a portion of the read bit line active region 412_b_.

The floating gate structure 432_a_ and the storage source/drain regions 436_a_ and 438_a_ correspond to a storage transistor structure 440_a_ of the memory structure 400. The storage transistor structure 440_a_ may correspond to the storage transistor 212_a_ of the non-volatile memory cell 200. The floating gate structure 432_b_ and the storage source/drain regions 436_b_ and 438_b_ correspond to a storage transistor structure 440_b_ of the memory structure 400. The storage transistor structure 440_b_ may correspond to the storage transistor 212_b_ of the non-volatile memory cell 200.

A source/drain contact 442_a_ may be included above the storage source/drain region 438_a_ and may be electrically coupled and/or physically coupled with the storage source/drain region 438_a_. The source/drain contact 442_a_ electrically connects the storage source/drain region 438_a_ to a write bit line metallization layer (not shown) corresponding to the write bit line 220_a_ of the non-volatile memory cell 200. One or more source/drain contacts 442_b_ may be included above the storage source/drain region 438_b_ and may be electrically coupled and/or physically coupled with the storage source/drain region 438_b_. The source/drain contact(s) 442_b_ electrically connect the storage source/drain region 438_b_ to a read bit line metallization layer corresponding to the read bit line 220_b_ of the non-volatile memory cell 200.

The source/drain contact 442_a_ enables a write bit line voltage ($V_{BL\_W}$) to be applied to the storage source/drain region 438_a_. The source/drain contact(s) 442_b_ enable a read bit line voltage ($V_{BL\_R}$) to be applied to the storage source/drain region 438_b_. In some implementations, the quantity of source/drain contacts 442_b_ is greater than the quantity of source/drain contacts 442_a_ because of a cell read current for the memory structure 400 being greater than a cell write current for the memory structure 400. The greater quantity of source/drain contacts 442_b_ enables the source/drain contacts 442_b_ to accommodate the greater cell read current.

The source/drain contacts 442_a_ and 442_b_ may each include a via, a plug, a pad, and/or other types of contact structure. The source/drain contacts 442_a_ and 442_b_ each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

The select transistor structures 426*a* and/or 426*b*, and/or the storage transistor structures 440*a* and/or 440*b*, may each include a metal oxide semiconductor field effect transistor (MOSFET), a high voltage transistor, a bipolar junction transistor (BJT), an n-channel metal oxide semiconductor (nMOS) transistor, a p-channel metal oxide semiconductor (pMOS) transistor, or another suitable transistor. In some implementations, select transistor structures 426*a* and/or 426*b*, and/or the storage transistor structures 440*a* and/or 440*b*, may each include a planar transistor structure, fin field effect transistor (finFET) structure, a nanostructure transistor structure (e.g., a gate all around (GAA) transistor, a nanosheet transistor, a nanotube transistor, a nanoribbon transistor), and/or another type of transistor structure.

The erase line capacitor active region 414 and the floating gate structure 432*c* correspond to an erase line capacitor structure 444 of the memory structure 400. The erase line capacitor structure 444 corresponds to the erase line capacitor 222 of the non-volatile memory cell 200. One or more contacts 446 may be included above the erase line capacitor active region 414, and may be electrically coupled and/or physically coupled with the erase line capacitor active region 414. The contact(s) 446 electrically connect the erase line capacitor active region 414 with an erase line metallization layer (not shown) corresponding to the erase line 224 of the non-volatile memory cell 200. The contact(s) 446 enable an erase line voltage ($V_{EL}$) to be applied to the erase line capacitor active region 414. The contact(s) 446 each include a via, a plug, a pad, and/or another type of contact structure. The contact(s) 446 each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

The word line capacitor active region 416 and the floating gate structure 432*d* correspond to a word line capacitor structure 448 of the memory structure 400. The word line capacitor structure 448 corresponds to the word line capacitor 226 of the non-volatile memory cell 200. One or more contacts 450 may be included above the word line capacitor active region 416, and may be electrically coupled and/or physically coupled with the word line capacitor active region 416. The contact(s) 450 electrically connect the word line capacitor active region 416 with a word line metallization layer (not shown) corresponding to the word line 228 of the non-volatile memory cell 200. The contact(s) 450 enable a word line voltage ($V_{WL}$) to be applied to the word line capacitor active region 416. The contact(s) 450 each include a via, a plug, a pad, and/or another type of contact structure. The contact(s) 450 each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

FIG. 4B illustrates a cross-section view of a portion of the memory structure 400 along the line A-A in FIG. 4A. The cross-section view is a cross-section view along the write bit line active region 412*a*. The cross-section view along the read bit line active region 412*b* may have a similar cross-section view.

As shown in FIG. 4B, the select transistor structure 426*a* and the storage transistor structure 440*a* are included in and/or above the well region 406. The select source/drain regions 422*a* and 424*a*, the portion of the well region 406 between the select source/drain regions 422*a* and 424*a*, the storage source/drain regions 436*a* and 438*a*, and the portion of the well region 406 between the storage source/drain regions 436*a* and 438*a* corresponds to the write bit line active region 412*a*.

Extension regions 452 may be included in the well region 406 adjacent to one or more of the select source/drain regions 422*a* and 424*a*, and/or adjacent to one or more of the storage source/drain regions 436*a* and 438*a*. The extension regions 452 may include doped regions of the well region 406 that are doped with the same dopant type as the select source/drain regions 422*a* and 424*a* and/or the storage source/drain regions 436*a* and 438*a*. Gate dielectric layers 454 may be included between the well region 406 and the select gate structure 418*a*, and/or between the well region 406 and the floating gate structure 432*a*.

A dielectric layer 456 may be included over the memory structure 400. The dielectric layer 456 may include an interlayer dielectric (ILD) layer and/or another type of dielectric layer. The dielectric layer 456 may provide electrical isolation between structures in the memory structure 400, and/or may provide a substantially flat surface on which subsequent layers (e.g., layers of an interconnect structure illustrated and described in connection with FIGS. 5A-5D) may be formed. The dielectric layer 456 may include one or more dielectric materials, such as a silicon oxide ($SiO_x$ such as $SiO_2$), a silicon nitride ($Si_xN_y$, such as $Si_3N_4$), a silicon oxy carbide (SiOC), a silicon oxycarbonitride (SiOCN), and/or another suitable dielectric material.

As indicated above, FIGS. 4A and 4B are provided as an example. Other examples may differ from what is described with regard to FIGS. 4A and 4B.

FIGS. 5A-5D are diagrams of an example semiconductor device 500 described herein. The semiconductor device 500 includes an example of a semiconductor device that includes one or more of the memory structures 400. Examples include a semiconductor memory device, an image sensor device (e.g., a complementary metal oxide semiconductor (CMOS) image sensor (CIS) device), a semiconductor logic device (e.g., a processor, a central processing unit (CPU), a graphics processing unit (GPU), a digital signal processor (DSP)), an input/output device, an application specific integrated circuit (ASIC), or another type of semiconductor device.

Figure 5A:
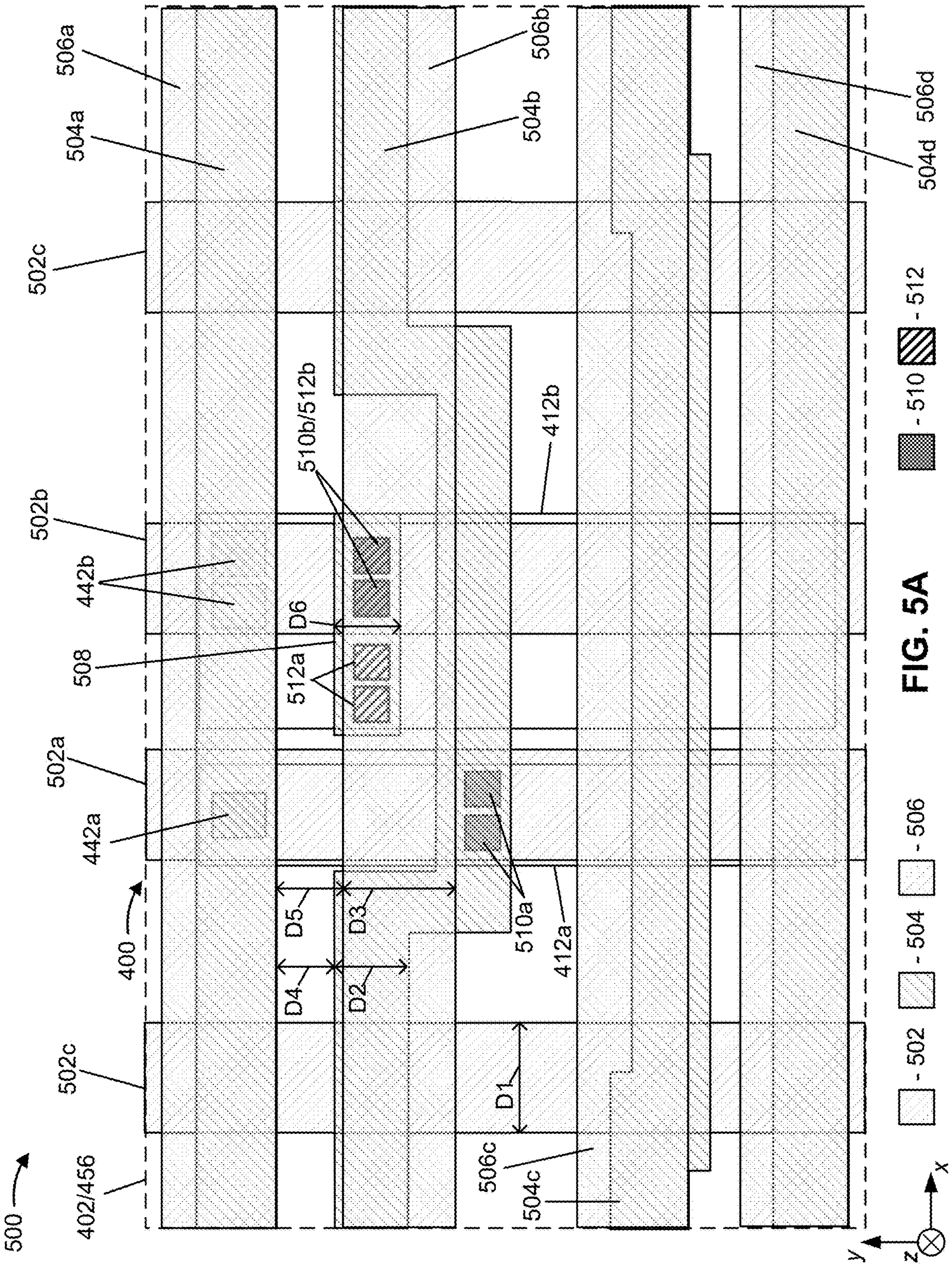
FIGS. 5A-5D are diagrams of an example semiconductor device described herein.

FIG. 5A illustrates a top-down view of the semiconductor device 500. In particular, FIG. 5A illustrates a layout of a plurality of metallization layers of the semiconductor device 500. The metallization layers may be included in an interconnect structure of the semiconductor device 500. The interconnect structure may be located above the memory structure 400 in the semiconductor device 500, and above the substrate 402 and/or the dielectric layer 456 of the memory structure 400.

As shown in FIG. 5A, the interconnect structure of the semiconductor device 500 includes a first metallization layer 502. The first metallization layer 502 may be the first metallization layer (e.g., an M1 layer) in the interconnect structure above the memory structure 400, and may be included directly above the dielectric layer 456 and the contacts (e.g., source/drain contacts 428*a* and 428*b*, gate contact 430, source/drain contacts 442*a* and 442*b*, contact(s) 446, contact(s) 450) of the memory structure 400. The first metallization layer 502 includes a plurality of metal lines 502*a*-502*d* that extend in the y-direction in the semiconductor device 500. The quantity of metal lines 502*a*-502*d* of the first metallization layer 502 illustrated in FIG. 5A is an example, and other quantities of metal lines for the first metallization layer 502 are within the scope of the present disclosure. The metal lines 502*a*-502*d* may each include a trench, a conductive trace, and/or another type of elongated conductive structure in the x-y plane in the semiconductor device 500. The metal lines 502*a*-502*d* may each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

The interconnect structure of the semiconductor device 500 further includes a second metallization layer 504. The second metallization layer 504 may be the second metallization layer (e.g., an M2 layer) in the interconnect structure above the memory structure 400, and may be included directly above the first metallization layer 502. The second metallization layer 504 includes a plurality of metal lines 504*a*-504*d* that extend in the x-direction in the semiconductor device 500 and are spaced apart in the y-direction. The quantity of metal lines 504*a*-504*d* of the second metallization layer 504 illustrated in FIG. 5A is an example, and other quantities of metal lines for the second metallization layer 504 are within the scope of the present disclosure. The metal lines 504*a*-504*d* may each include a trench, a conductive trace, and/or another type of elongated conductive structure in the x-y plane in the semiconductor device 500. The metal lines 504*a*-504*d* may each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

The interconnect structure of the semiconductor device 500 further includes a third metallization layer 506. The third metallization layer 506 may be the third metallization layer (e.g., an M3 layer) in the interconnect structure above the memory structure 400, and may be included directly above the second metallization layer 504. The third metallization layer 506 includes a plurality of metal lines 506*a*-506*d* that extend in the x-direction in the semiconductor device 500 and are spaced apart in the y-direction. The quantity of metal lines 506*a*-506*d* of the third metallization layer 506 illustrated in FIG. 5A is an example, and other quantities of metal lines for the third metallization layer 506 are within the scope of the present disclosure. The metal lines 506*a*-506*d* may each include a trench, a conductive trace, and/or another type of elongated conductive structure in the x-y plane in the semiconductor device 500. The metal lines 506*a*-506*d* may each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

The semiconductor device 500 further includes a connection pad structure 508. The connection pad structure 508 is a part of the second metallization layer 504 (e.g., the connection pad structure 508 is located at a similar vertical or z-direction height in the semiconductor device 500 as the second metallization layer 504) and is formed during the same process (or processes) as the second metallization layer 504. Thus, the connection pad structure 508 is formed of similar materials as the second metallization layer 504. The connection pad structure 508 is spaced apart from the metal lines 504*a*-504*d* of the second metallization layer 504.

The metal lines 504*a*-504*d* of the second metallization layer 504 at least partially overlap with one or more of the metal lines 502*a*-502*d* of the first metallization layer 502. This enables the first metallization layer 502 and the second metallization layer 504 to be interconnected by interconnect structures 510. For example, one or more interconnect structures 510*a* may be located between the metal line 502*a* of the first metallization layer 502 and the metal line 504*b* of the second metallization layer 504, and may electrically couple the metal line 502*a* of the first metallization layer 502 and the metal line 504*b* of the second metallization layer 504. The metal line 502*a* of the first metallization layer 502 may be electrically coupled with the storage source/drain region 438*a* of the storage transistor structure 440*a* through the source/drain contact 442*a*. This enables the write bit line voltage ($V_{BL\_W}$) to be applied to the storage source/drain region 438*a* of the storage transistor structure 440*a* from the second metallization layer 504. Thus, the metal line 504*b* of the second metallization layer 504 is a write bit line metallization layer of the memory structure 400.

Moreover, the connection pad structure 508 of the second metallization layer 504 also at least partially overlaps with one or more of the metal lines 502*a*-502*d* of the first metallization layer 502. This enables the first metallization layer 502 and the connection pad structure 508 to be interconnected by the interconnect structures 510. For example, one or more interconnect structures 510*b* may be located between the metal line 502*b* of the first metallization layer 502 and the connection pad structure 508 of the second metallization layer 504, and may electrically couple the metal line 502*b* of the first metallization layer 502 and the connection pad structure 508 of the second metallization layer 504. The metal line 502*b* of the first metallization layer 502 may be electrically coupled with the storage source/drain region 438*b* of the storage transistor structure 440*b* through the source/drain contact(s) 442*b*.

The interconnect structures 510 may each include a via, a plug, a conductive pillar or column, and/or another type of elongated conductive structure that extends in a z-direction in the semiconductor device 500. The interconnect structures 510 may each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

The metal lines 506*a*-506*d* of the third metallization layer 506 may at least partially overlap the metal lines 504*a*-504*d* of the second metallization layer 504. This enables the metal lines 504*a*-504*d* of the second metallization layer 504 and the metal lines 506*a*-506*d* of the third metallization layer 506 to be interconnected by interconnect structures 512. A plurality of interconnect structures 512 may be located between the connection pad structure 508 of the second metallization layer 504 and the metal line 506*b* of the third metallization layer 506, and may electrically couple the connection pad structure 508 of the second metallization layer 504 and the metal line 506*b* of the third metallization layer 506. One or more interconnect structures 512*a* may be offset from the metal line 502*b* of the first metallization layer 502 along the x-direction, and one or more interconnect structures 512*b* may be located adjacent to the one or more interconnect structures 512*b* and above the interconnect structures 510*b*.

The source/drain contact(s) 442*b*, the metal line 502*b* of the first metallization layer 502, the interconnect structures 510*b*, the connection pad structure 508, and the interconnect structures 512 form an electrically conductive path between the storage source/drain region 438*b* of the storage transistor structure 440*b* and the metal line 506*b* of the third metallization layer 506. This enables the read bit line voltage ($V_{BL\_R}$) to be applied to the storage source/drain region 438*b* of the storage transistor structure 440*b* from the metal line 506*b* of the third metallization layer 506 through the source/drain contact(s) 442*b*, the metal line 502*b* of the first metallization layer 502, the interconnect structures 510*b*, the connection pad structure 508, and the interconnect structures 512. Thus, the metal line 506*b* of the third metallization layer 506 is a read bit line metallization layer of the memory structure 400.

The interconnect structures 512 may each include a via, a plug, a conductive pillar or column, and/or another type of elongated conductive structure that extends in a z-direction in the semiconductor device 500. The interconnect structures 512 may each include one or more electrically conductive materials such as tungsten (W), cobalt (Co), ruthenium (Ru), titanium (Ti), aluminum (Al), copper (Cu), gold (Au), and/or a combination thereof, among other examples of electrically conductive materials.

The first metallization layer 502, the second metallization layer 504, and the third metallization layer 506 have different top view widths. In particular, the metallization layers in the semiconductor device 500 are arranged in the z-direction in increasing top view widths. A maximum x-direction top view width of the metal lines 502*a*-502*d* of the first metallization layer 502 (indicated in FIG. 5A as dimension D1) is less than a maximum y-direction top view width of the metal lines 504*a*-504*d* of the second metallization layer 504 (indicated in FIG. 5A as dimension D2). A maximum y-direction top view width of the metal lines 506*a*-506*d* of the third metallization layer 506 (indicated in FIG. 5A as dimension D3) is greater than the maximum y-direction top view width of the metal lines 504*a*-504*d* of the second metallization layer 504. Moreover, a minimum spacing or distance between adjacent metal lines 504*a*-504*d* of the second metallization layer 504 (indicated in FIG. 5A as dimension D4) is less than a minimum spacing or distance between adjacent metal lines 506*a*-506*d* of the third metallization layer 506 (indicated in FIG. 5A as dimension D5).

As indicated above, the cell read current for the memory structure 400 is greater than a cell write current for the memory structure 400. The greater maximum top view width of the third metallization layer 506 enables the third metallization layer to better handle the cell read current of the memory structure 400 (which is greater than a cell write current of the memory structure 400) than the second metallization layer 504. In particular, the greater maximum top view width of the third metallization layer 506 enables the third metallization layer 506 to better withstand electromigration at greater operating currents because of the greater heat dissipation in the third metallization layer 506 than in the second metallization layer 504. Thus, at high operating temperatures, such as in an automotive or industrial application, the greater top view width of the third metallization layer 506 provides a lesser likelihood of electromigration in the read bit line metallization layer of the memory structure 400 than if the second metallization layer 504 were to be used as the read bit line metallization layer. This reduces the likelihood of short circuiting and/or open circuiting in the memory structure 400, which may increase the operating life of the memory structure 400 and/or reduce the likelihood of failure of the memory structure 400 at high operating temperatures without expanding the footprint of memory structure 400.

Moreover, the write cell current of the memory structure 400 being less than the read cell current of the memory structure 400 enables the metal lines 504*a*-504*d* of the second metallization layer 504 to have a lesser top view width and closer spacing than the metal lines 506*a*-506*d* of the third metallization layer 506. This enables the x-y size of the connection pad structure 508 to be greater than if the second metallization layer 504 were used as the read bit line metallization layer of the memory structure 400. The greater x-y size of the connection pad structure 508 enables a greater quantity of interconnect structures 512 to be included between the connection pad structure 508 and the third metallization layer 506. The greater quantity of interconnect structures 512 enables a sufficiently high current flow rate and a sufficiently low current density to be achieved for the cell read current, which may increase the electromigration reliability of the semiconductor device 500 than if fewer interconnect structures 512 were included in the semiconductor device 500.

In some implementations, the top view width of a metal line of the second metallization layer 504 (e.g., the dimension D2) is included in a range of approximately 0.2 microns to approximately 0.45 microns to enable a sufficiently high density of metal lines to be included in the second metallization layer 504 while achieving a low likelihood of electromigration in the write bit line metallization layer of the memory structure 400. Top view widths of less than approximately 0.2 microns for the metal line of the second metallization layer 504 may result in an amount of electromigration in the write bit line metallization layer of the memory structure 400 that significantly reduces the reliability of the memory structure 400. Top view widths of greater than approximately 0.45 microns for the metal line of the second metallization layer 504 may result in insufficient metal line density in the second metallization layer 504 because of the minimum spacing between the metal lines 504*a*-504*d* of the second metallization layer 504. However, other values for the top view width of the metal line of the second metallization layer 504, and ranges other than approximately 0.2 microns to approximately 0.45 microns are within the scope of the present disclosure. Another example range includes approximately 0.15 microns to approximately 0.8 microns.

In some implementations, the top view width of a metal line of the third metallization layer 506 (e.g., the dimension D3) is included in a range of approximately 0.25 microns to approximately 0.65 microns to enable a sufficiently high density of metal lines to be included in the third metallization layer 506 while achieving a low likelihood of electromigration in the read bit line metallization layer of the memory structure 400. Top view widths of less than approximately 0.25 microns for the metal line of the third metallization layer 506 may result in an amount of electromigration in the read bit line metallization layer of the memory structure 400 that significantly reduces the reliability of the memory structure 400. Top view widths of greater than approximately 0.65 microns for the metal line of the third metallization layer 506 may result in insufficient metal line density in the third metallization layer 506 because of the minimum spacing between the metal lines 506*a*-506*d* of the third metallization layer 506. However, other values for the top view width of the metal line of the third metallization layer 506, and ranges other than approximately 0.25 microns to approximately 0.65 microns are within the scope of the present disclosure. Another example range includes approximately 0.15 microns to approximately 0.8 microns.

In some implementations, the top view width of a metal line of the third metallization layer 506 (e.g., the dimension D3) is selected based on an intended use case or designed-for use case of the semiconductor device 500. For example, the top view width of a metal line of the third metallization layer 506 may be selected based on an automotive application and/or an industrial application for the semiconductor device 500. In these implementations, the top view width of a metal line of the third metallization layer 506 may be selected based on the operating temperature range for the semiconductor device 500, based on an electromigration reliability requirement for the semiconductor device 500, based on an operational lifetime of the semiconductor device 500, based on a temperature profile for the use case of the semiconductor device 500, and/or based on another parameter. For example, the top view width of a metal line of the third metallization layer 506 may be selected based on a maximum silicon temperature for the semiconductor device 500, a three-year lifetime threshold for the semiconductor device 500, a temperature profile of approximately 5% to approximately 15% of the three-year lifetime at an operating temperature of approximately 175 degrees Celsius, and a read cell current of approximately 120 micro amps. The top view width of a metal line of the third metallization layer 506 may be selected to achieve a maximum cell current for the memory structure 400 that is at least twice the read cell current so as to achieve a low electromigration in the above-described operating parameters. However, other examples of operating parameters are within the scope of the present disclosure.

In some implementations, the top view distance (or spacing) between adjacent metal lines of the second metallization layer 504 (e.g., the dimension D4) is included in a range of approximately 0.2 microns to approximately 0.45 microns to enable a sufficiently high density of metal lines to be included in the second metallization layer 504 while achieving sufficient electrical isolation between the metal lines of the second metallization layer 504 so as to pass acceptance testing. Distances less than approximately 0.2 microns for the second metallization layer 504 may result in insufficient electrical isolation between the metal lines of the second metallization layer 504, which may cause the semiconductor device 500 to fail acceptance testing and/or to be non-operational. Distances greater than approximately 0.45 microns for the second metallization layer 504 may result in insufficient metal line density in the second metallization layer 504. However, other values for the top view distance (or spacing) between the adjacent metal lines in the second metallization layer 504, and ranges other than approximately 0.2 microns to approximately 0.45 microns are within the scope of the present disclosure. Another example range includes approximately 0.13 microns to approximately 0.45 microns.

In some implementations, the top view distance (or spacing) between adjacent metal lines of the third metallization layer 506 (e.g., the dimension D5) is included in a range of approximately 0.25 microns to approximately 0.5 microns to enable a sufficiently high density of metal lines to be included in the third metallization layer 506 while achieving sufficient electrical isolation between the metal lines of the third metallization layer 506 so as to pass acceptance testing. Distances less than approximately 0.25 microns for the third metallization layer 506 may result in insufficient electrical isolation between the metal lines of the third metallization layer 506, which may cause the semiconductor device 500 to fail acceptance testing and/or to be non-operational. Distances greater than approximately 0.5 microns for the third metallization layer 506 may result in insufficient metal line density in the third metallization layer 506. However, other values for the top view distance (or spacing) between the adjacent metal lines in the third metallization layer 506, and ranges other than approximately 0.25 microns to approximately 0.5 microns are within the scope of the present disclosure. Another example range includes approximately 0.13 microns to approximately 0.45 microns.

In some implementations, the top view distance (or spacing) between adjacent metal lines of the second metallization layer 504, between adjacent metal lines of the third metallization layer 506, between adjacent interconnect structures 510, and/or between adjacent interconnect structures 512 is selected based on an intended use case or designed-for use case of the semiconductor device 500. For example, the top view distance (or spacing) may be selected based on an automotive application and/or an industrial application for the semiconductor device 500. In these implementations, the top view distance (or spacing) may be selected based on the operating temperature range for the semiconductor device 500, based on an electrical isolation requirement for the semiconductor device 500, based on an operational lifetime of the semiconductor device 500, based on a temperature profile for the use case of the semiconductor device 500, based on the operational voltages for the memory structure 400, and/or based on another parameter. For example, a plurality of voltage ranges may be specified for the automotive application and/or an industrial application, and minimum distances or spacings may be associated with each voltage range. The top view distance (or spacing) may be selected based on the operating voltages of the memory structure 400 being within a particular voltage range of the plurality of voltage ranges.

In some implementations, the top view width of the connection pad structure 508 (e.g., the dimension D6) is included in a range of approximately 0.15 microns to approximately 0.25 microns to enable a sufficiently high density of interconnect structures 512 to be coupled with the connection pad structure 508 while achieving a low likelihood of electromigration in the write bit line metallization layer of the memory structure 400. Top view widths of less than approximately 0.25 microns for the connection pad structure 508 may result in an amount of electromigration in the write bit line metallization layer of the memory structure 400 that significantly reduces the reliability of the memory structure 400 because not enough interconnect structures 512 can be coupled with the connection pad structure 508. Top view widths of greater than approximately 0.5 microns for the connection pad structure 508 may result in insufficient metal line density in the second metallization layer 504 because of the minimum spacing between the connection pad structure 508 and the metal lines 504*a*-504*d* of the second metallization layer 504. However, other values for the top view width of the connection pad structure 508, and ranges other than approximately 0.25 microns to approximately 0.5 microns are within the scope of the present disclosure. Another example range includes approximately 0.15 microns to approximately 0.8 microns.

Figure 5B:
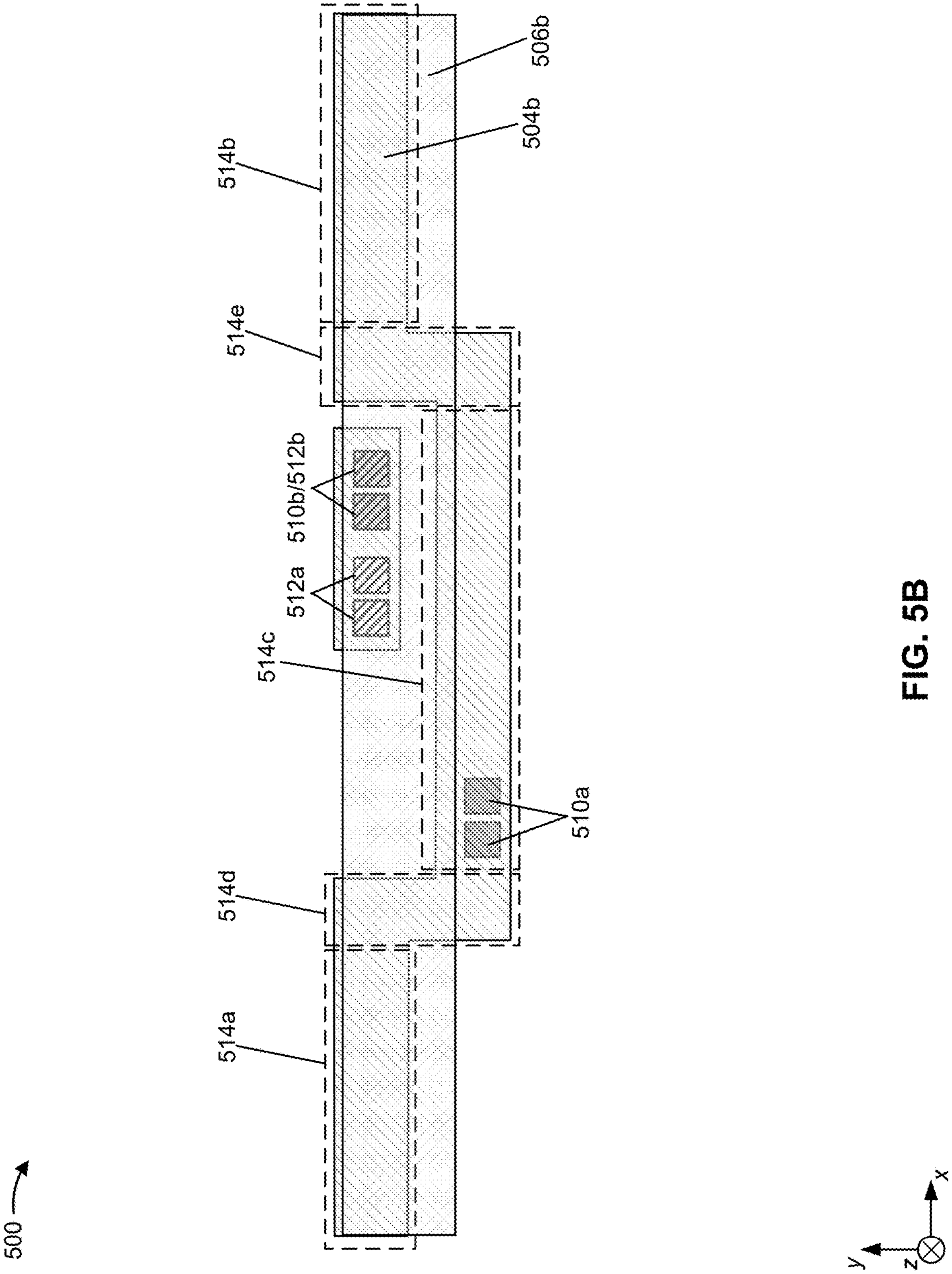

FIG. 5B illustrates a detailed top view of the metal line 504*b* (e.g., the write bit line metallization layer of the memory structure 400) of the second metallization layer 504 and the metal line 506*b* (e.g., the read bit line conductive structure of the memory structure 400) of the third metallization layer 506. As shown in FIG. 5B, the metal line 506*b* at least partially overlaps the metal line 504*b*. As further shown in FIG. 5B, the metal line 504*b* includes a plurality of segments 514*a*-514*e*. The segments 514*a*, 514*b*, and 514*c* extend approximately parallel to each other in the x-direction in the semiconductor device 500. The segments 514*d* and 514*e* extend approximately parallel to each other in the y-direction and are approximately perpendicular to the segments 514*a*, 514*b*, and 514*c*.

The segments 514*a* and 514*d* are located adjacent to a first end of the connection pad structure 508 in the top view of the semiconductor device 500. The segments 514*b* and 514*e* are adjacent to a second end of the connection pad structure 508 opposing the first end in the top view of the semiconductor device 500. The segment 514*c* is offset relative to the segments 514*a* and 514*b* and is adjacent to a side of the connection pad structure 508 in the top view of the semiconductor device 500.

The offset of the segment 514*c* relative to the segments 514*a* and 514*b* enables the connection pad structure 508 to be located at least partially under the metal line 506*b*. This enables the interconnect structures 512*a* and 512*b* to extend between the connection pad structure 508 and the metal line 506*b* in the z-direction in the semiconductor device 500. The interconnect structures 510*a* are coupled with the segment 514*c*, and may be located under a portion of the segment 514*c* that extends laterally outward from the metal line 506*b*. In other words, the interconnect structures 510*a* may be coupled with a portion of the segment 514*c* that is not located under the metal line 506*b*.

The segment 514*d* is a transition segment of the metal line 504*b* that provides a transition between the segment 514*a* and the segment 514*c*. The segment 514*e* is a transition segment of the metal line 504*b* that provides a transition between the segment 514*b* and the segment 514*c*. The metal line 506*b* at least partially overlaps the segments 514*d* and 514*e*.

Figure 5D:
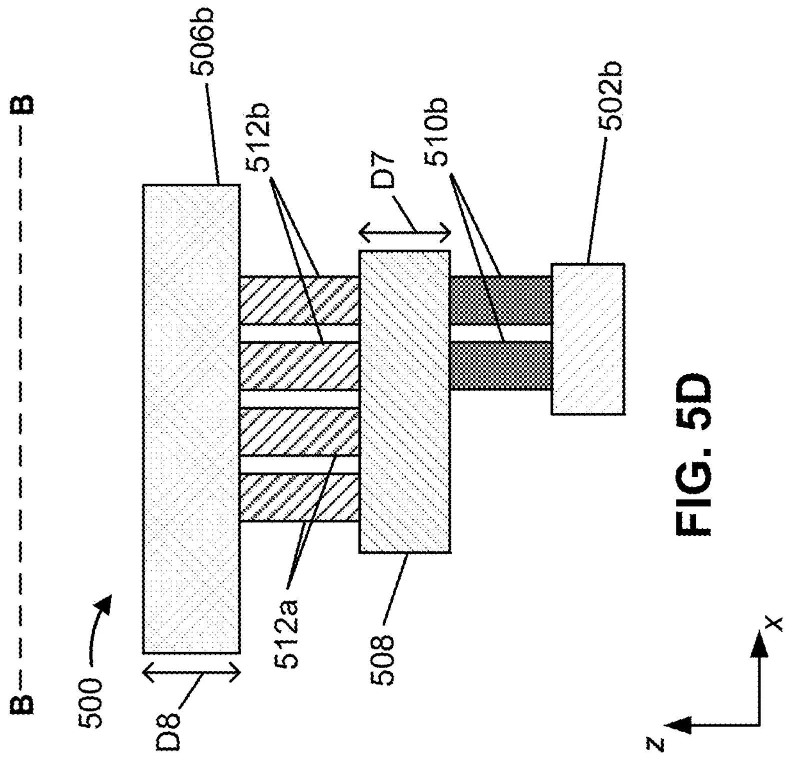
Figure 5C:
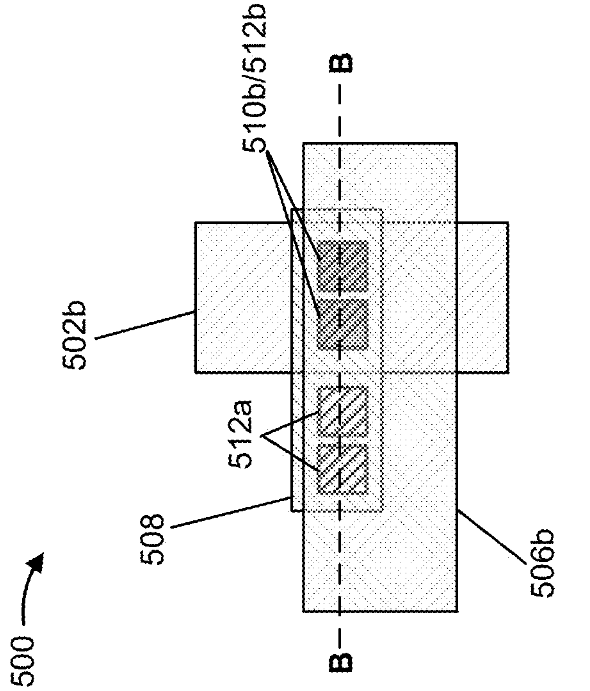

FIGS. 5C and 5D illustrate details of the interconnections between the metal line 502*b* of the first metallization layer 502, the connection pad structure 508 of the second metallization layer 504, and the metal line 506*b* of the third metallization layer 506. FIG. 5C illustrates a top down view of a portion of the semiconductor device 500, and FIG. 5D illustrates a cross-section view of the portion of the semiconductor device 500 along the line B-B in FIG. 5C.

As shown in FIGS. 5C and 5D, the interconnect structures 510*b* extend in the z-direction in the semiconductor device 500 between the metal line 502*b* and the connection pad structure 508. The interconnect structures 510*b* are physically coupled and/or electrically coupled with the metal line 502*b* and the connection pad structure 508. The interconnect structures 512*a* and 512*b* extend in the z-direction in the semiconductor device 500 between the connection pad structure 508 and the metal line 506*b*. The interconnect structures 512*a* and 512*b* are physically coupled and/or electrically coupled with the connection pad structure 508 and the metal line 506*b*. The interconnect structures 512*b* are directly above the interconnect structures 510*b*. The interconnect structures 512*a* are offset relative to the interconnect structures 510*b*.

The connection pad structure 508 (as well as the metal lines 504*a*-504*d*) of the second metallization layer 504 may have a z-direction thickness (illustrated in FIG. 5D as dimension D7). The metal line 506*b* (as well as the metal lines 506*a*, 506*c*, and 506*d*) of the third metallization layer 506 may have a z-direction thickness (illustrated in FIG. 5D as dimension D8). The z-direction thickness of the third metallization layer 506 (e.g., the dimension D8) is greater than the z-direction thickness of the second metallization layer 504 (e.g., the dimension D7). The greater thickness of the third metallization layer 506 enables the third metallization layer 506 to accommodate the greater read cell current of the memory structure 400 than the write cell current handled by the second metallization layer 504.

As indicated above, FIGS. 5A-5D are provided as an example. Other examples may differ from what is described with regard to FIGS. 5A-5D.

FIGS. 6A-6F are diagrams of an example implementation 600 of forming a memory structure 400 described herein. In some implementations, one or more of the semiconductor processing operations described in connection with FIGS. 6A-6F may be performed using one or more of the semiconductor processing tools 102-114 and/or the wafer/die transport tool 116. In some implementations, one or more of the processing operations described in connection with FIGS. 6A-6F may be performed using another semiconductor processing tool not shown in FIG. 1.

Figure 6A:
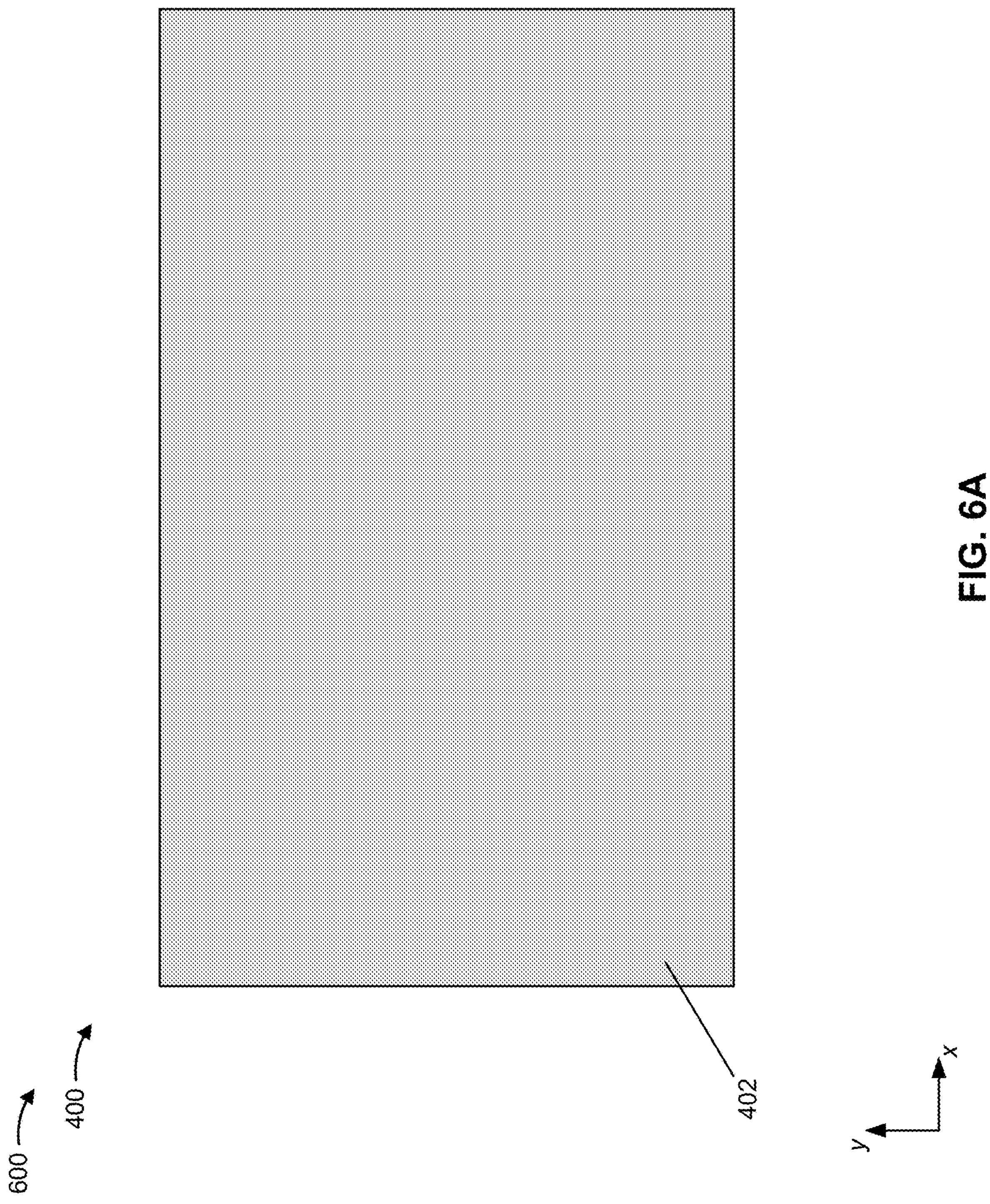
FIGS. 6A-6F are diagrams of an example implementation of forming a memory structure described herein.

Turning to FIG. 6A, the substrate 402 may be provided. The substrate 402 may be provided as a semiconductor wafer, a semiconductor die, and/or another type of semiconductor substrate. In some implementations, the substrate 402 may be a doped substrate, such as a semiconductor substrate that is doped with one or more p-type dopants, a semiconductor substrate that is doped with one or more n-type dopants, and/or another type of doped substrate. In some implementations, the substrate 402 has a bulk resistivity (or volumetric resistivity) that is included in a range of approximately 1 ohm-centimeter to approximately 100 ohm-centimeters. However, other values for the range are within the scope of the present disclosure.

Figure 6B:
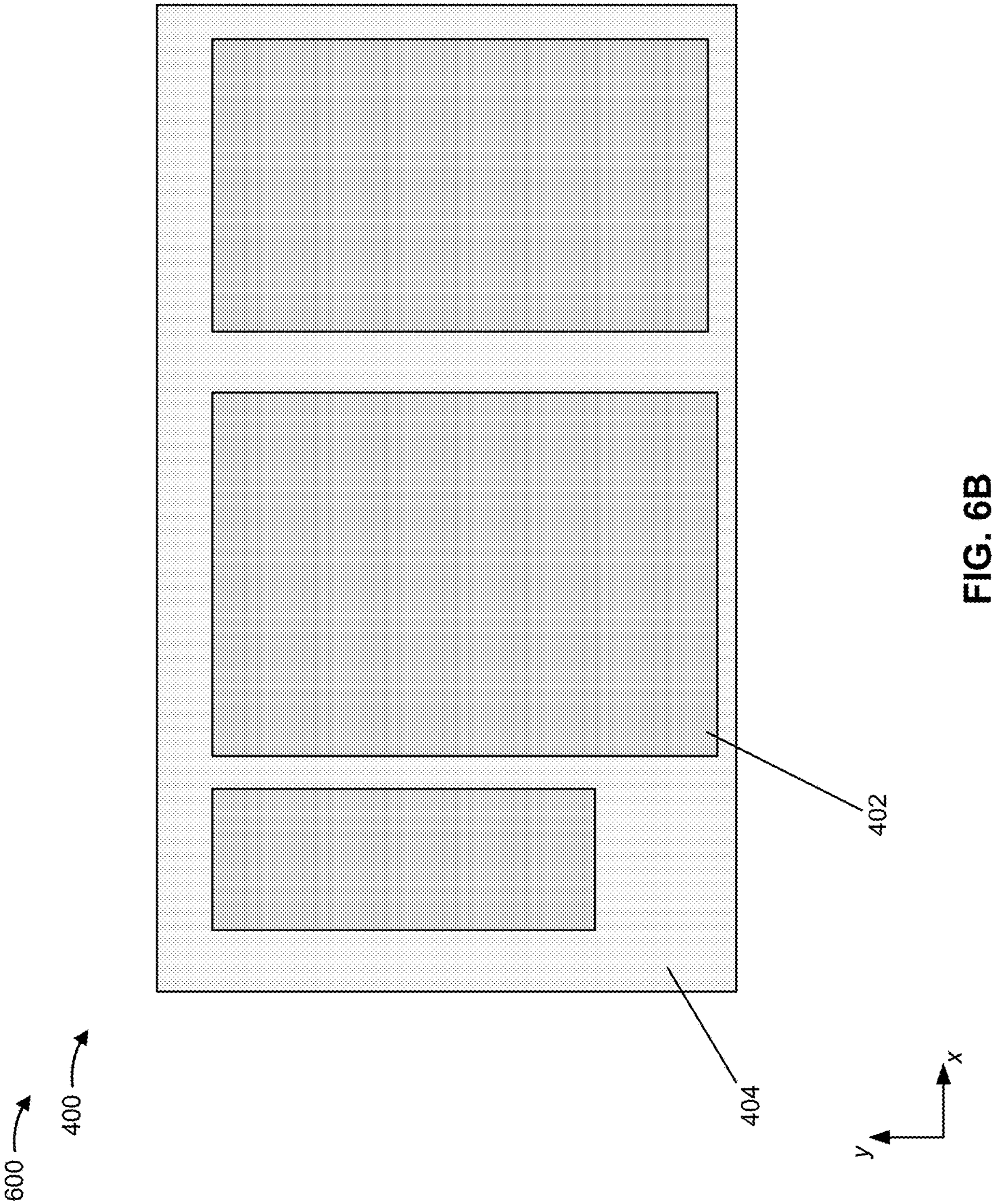

A shown in FIG. 6B, the isolation structure 404 is formed in and/or above the substrate 402. The isolation structure 404 may be formed in a recess in substrate 402. In some implementations, a pattern in a photoresist layer is used to etch the substrate 402 to form the recess. In these implementations, a deposition tool 102 may be used to form the photoresist layer on the substrate 402. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the substrate 402 based on the pattern to form the recess in the substrate 402. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the substrate 402 based on a pattern.

Figure 6C:
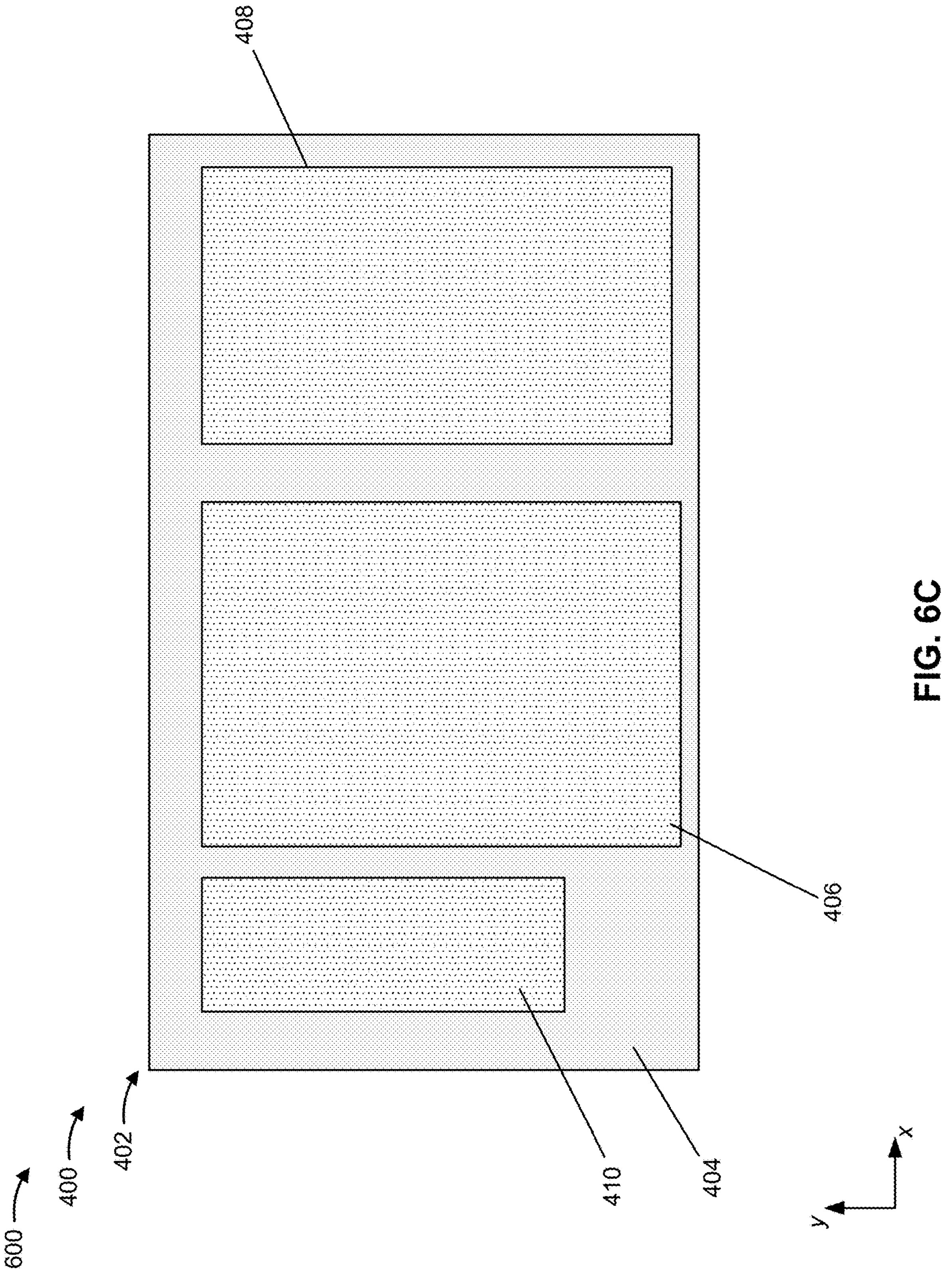

As shown in FIG. 6C, one or more regions of the substrate 402 are doped to form the well regions 406, 408, and 410 in the openings in the isolation structure 404. In some implementations, an ion implantation tool 114 may be used to form the well regions 406, 408, and/or 410 by performing one or more ion implantation operations to implant ions (e.g., p-type ions, n-type ions) into the substrate 402 to form the well regions 406, 408, and/or 410. The ion implantation tool 114 may be used to direct an ion beam toward the substrate 402 such that the ions are implanted below the surface of the substrate 402 to dope the substrate 402. Additionally and/or alternatively, a deposition tool 102 may be used to deposit the well regions 406, 408, and/or 410 in a PVD operation, an ALD operation, a CVD operation, an epitaxy operation, an oxidation operation, another type of deposition operation described in connection with FIG. 1, and/or another suitable deposition operation.

Figure 6D:
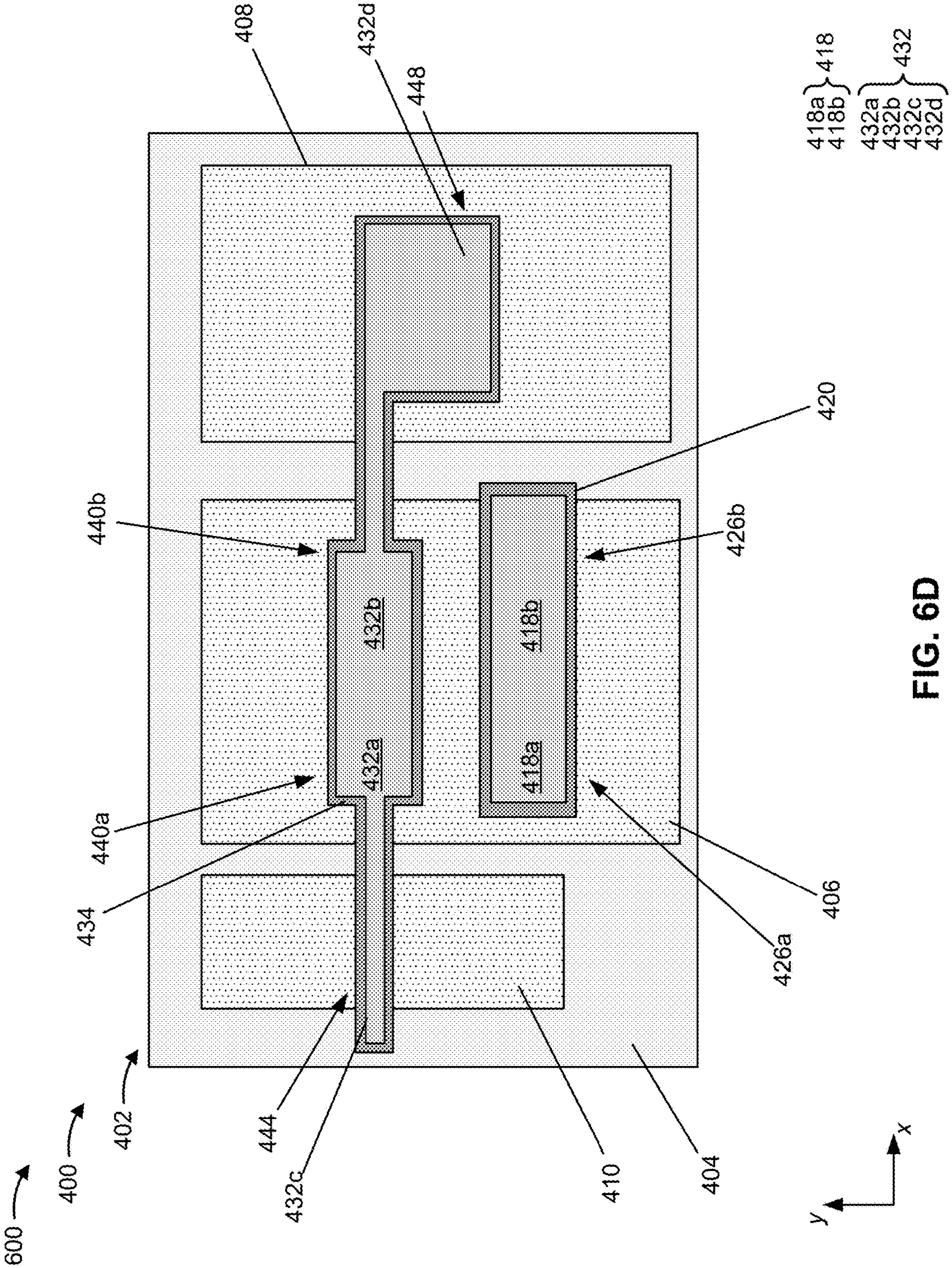

As shown in FIG. 6D, the select gate structure 418 is formed over the well region 406, including the select gate structure 418*a* of the select transistor structure 426*a* and the select gate structure 418*b* of the select transistor structure 426*b*. Moreover, the floating gate structure 432 may be formed, including the floating gate structure 432*a* of the storage transistor structure 440*a* over the well region 406, the floating gate structure 432*b* of the storage transistor structure 440*b* over the well region 406, the floating gate structure 432*c* over the well region 410, and the floating gate structure 432*d* over the well region 408.

Forming the select gate structure 418 may include depositing the material of the select gate structures 418*a* and 418*b*, depositing a conformal layer of dielectric material around the select gate structures 418*a* and 418*b*, and using an etch tool 108 to etch the conformal layer of dielectric material to form the sidewall spacer 420 around the select gate structures 418*a* and 418*b*. A deposition tool 102 and/or a plating tool 112 may be used to deposit the material of the select gate structures 418*a* and 418*b* using a CVD technique, a PVD technique, an ALD technique, an electroplating technique, another deposition technique described above in connection with FIG. 1, and/or another suitable deposition operation. In some implementations, a seed layer is first deposited, and the material of the select gate structures 418*a* and 418*b* is deposited on the seed layer. In some implementations, the planarization tool 110 may be used to planarize the material of the select gate structures 418*a* and 418*b* after the material of the select gate structures 418*a* and 418*b* is deposited. The deposition tool 102 may be used to deposit the material of the sidewall spacer 420 using a PVD technique, an ALD technique, a CVD technique, an oxidation technique, another type of deposition operation technique in connection with FIG. 1, and/or another suitable deposition technique.

Forming the floating gate structure 432 may include depositing the material of the floating gate structures 432*a*-432*d*, depositing a conformal layer of dielectric material around the floating gate structures 432*a*-432*d*, and using an etch tool 108 to etch the conformal layer of dielectric material to form the sidewall spacer 434 around the floating gate structures 432*a*-432*d*. A deposition tool 102 and/or a plating tool 112 may be used to deposit the material of the floating gate structures 432*a*-432*d* using a CVD technique, a PVD technique, an ALD technique, an electroplating technique, another deposition technique described above in connection with FIG. 1, and/or another suitable deposition operation. In some implementations, a seed layer is first deposited, and the material of the floating gate structures 432*a*-432*d* is deposited on the seed layer. In some implementations, the planarization tool 110 may be used to planarize the material of the floating gate structures 432*a*-432*d* after the material of the floating gate structures 432*a*-432*d* is deposited. The deposition tool 102 may be used to deposit the material of the sidewall spacer 434 using a PVD technique, an ALD technique, a CVD technique, an oxidation technique, another type of deposition operation technique in connection with FIG. 1, and/or another suitable deposition technique.

Figure 6E:
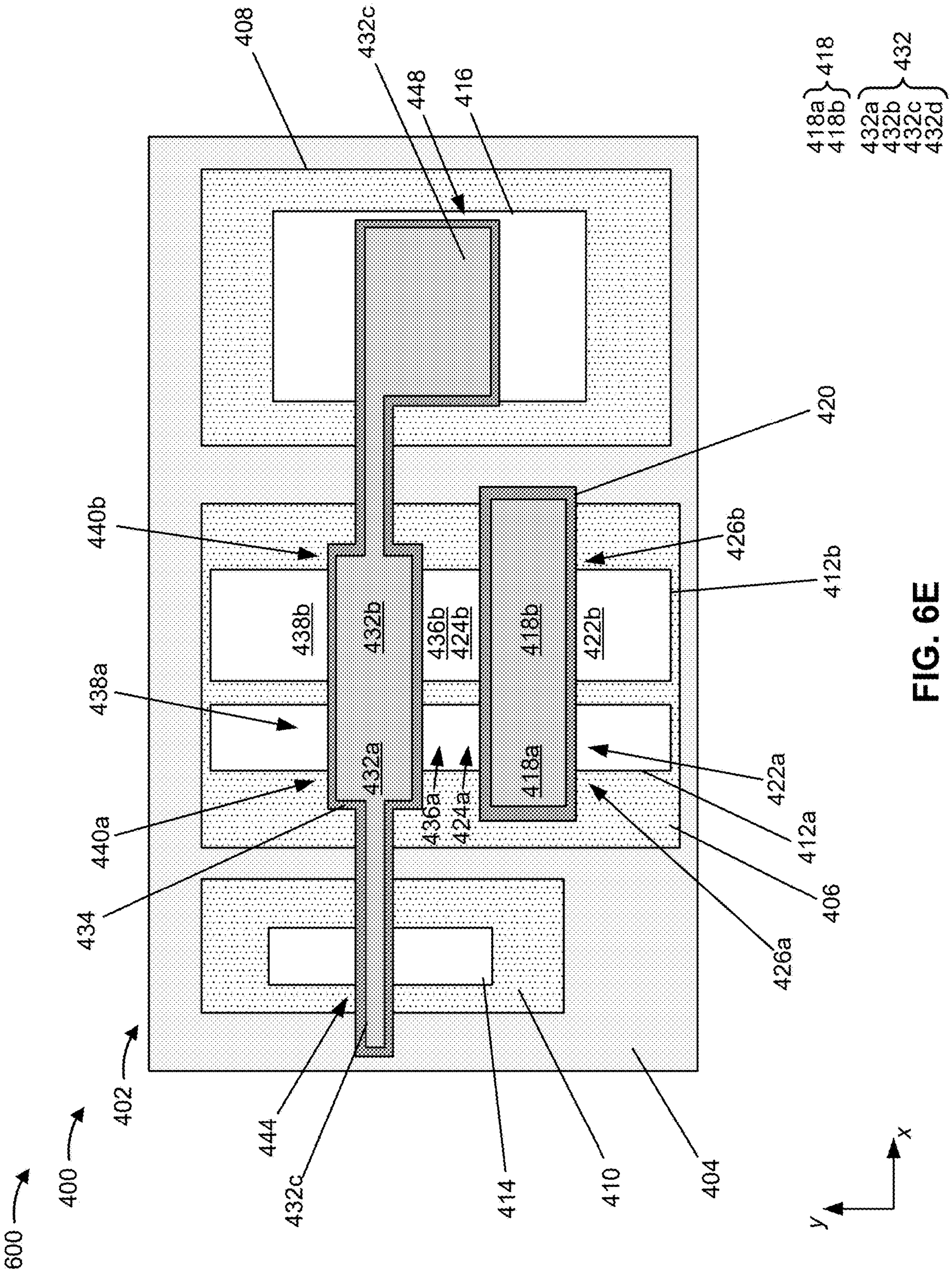

As shown in FIG. 6E, the write bit line active region 412*a* (including the select source/drain regions 422*a* and 424*a* of the select transistor structure 426*a* and the storage source/drain regions 436*a* and 438*a* of the storage transistor structure 440*a*) is formed in the well region 406. The select source/drain regions 422*a* and 424*a* may be formed on opposing sides of the select gate structure 418*a*, and the storage source/drain regions 436*a* and 438*a* may be formed on opposing sides of the floating gate structure 432*a*.

The read bit line active region 412*b*, including the select source/drain regions 422*b* and 424*b* of the select transistor structure 426*b* and the storage source/drain regions 436*b* and 438*b* of the storage transistor structure 440*b*, are also formed in the well region 406. The select source/drain regions 422*b* and 424*b* may be formed on opposing sides of the select gate structure 418*b*, and the storage source/drain regions 436*b* and 438*b* may be formed on opposing sides of the floating gate structure 432*b*.

The erase line capacitor active region 414 of the erase line capacitor structure 444 may be formed in the well region 410. The word line capacitor active region 416 of the word line capacitor structure 448 may be formed in the well region 408.

In some implementations, a deposition tool 102 is used to epitaxially grow the write bit line active region 412*a* (including the select source/drain regions 422*a* and 424*a* and the storage source/drain regions 436*a* and 438*a*), the read bit line active region 412*b* including the select source/drain regions 422*b* and 424*b* and the storage source/drain regions 436*b* and 438*b*), the erase line capacitor active region 414, and/or the word line capacitor active region 416. In some implementations, an ion implantation tool 114 is used to implant ions in the well region 406 to form the write bit line active region 412*a* (including the select source/drain regions 422*a* and 424*a* and the storage source/drain regions 436*a* and 438*a*) and/or the read bit line active region 412*b* including the select source/drain regions 422*b* and 424*b* and the storage source/drain regions 436*b* and 438*b*), to implant ions in the well region 410 to form the erase line capacitor active region 414, and/or to implant ions into the well region 408 to form the word line capacitor active region 416. In some implementations, recesses are formed in the well regions 406, 408, and/or 410, and a deposition tool 102 and/or a plating tool 112 is used to deposit the write bit line active region 412*a* (including the select source/drain regions 422*a* and 424*a* and the storage source/drain regions 436*a* and 438*a*), the read bit line active region 412*b* including the select source/drain regions 422*b* and 424*b* and the storage source/drain regions 436*b* and 438*b*), the erase line capacitor active region 414, and/or the word line capacitor active region 416 in the recesses.

Figure 6F:
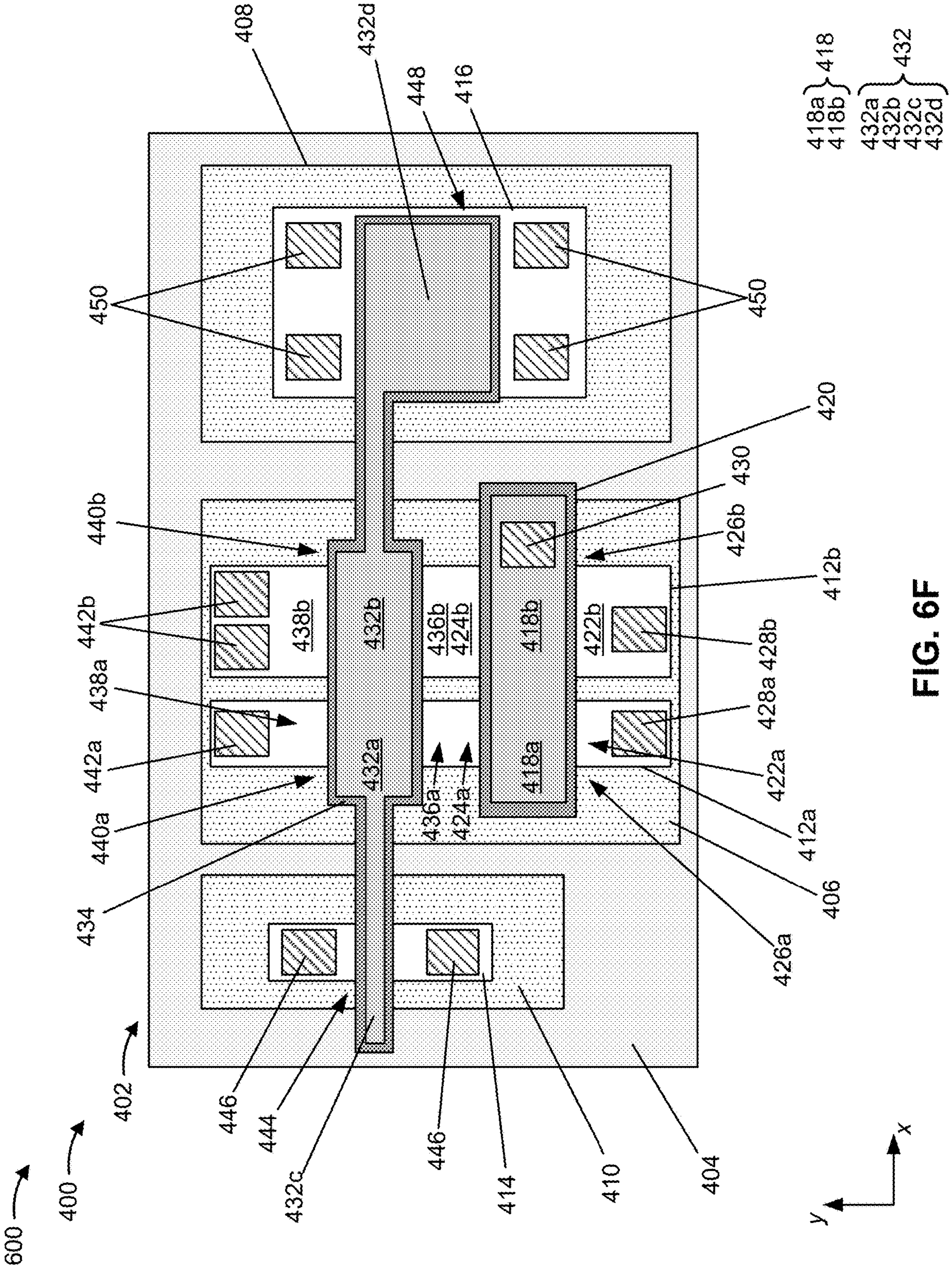

As shown in FIG. 6F, source/drain contacts 428*a* and 428*b* are respectively formed on the select source/drain regions 422*a* and 422*b*. Source/drain contacts 442*a* and 442*b* are respectively formed on the storage source/drain regions 438*a* and 438*b*. Gate contact(s) 430 are formed on the select gate structure 418. Contact(s) 446 are formed on the erase line capacitor active region 414. Contact(s) 450 are formed on the word line capacitor active region 416.

The source/drain contacts 428*a* and 428*b*, the source/drain contacts 442*a* and 442*b*, the contact(s) 446, and the contact(s) 450 may be formed in recesses in the dielectric layer 456 (not shown) above the memory structure 400. A deposition tool 102 may be used to deposit the dielectric layer 456 using a PVD technique, an ALD technique, a CVD technique, an oxidation technique, another type of deposition operation technique in connection with FIG. 1, and/or another suitable deposition technique. In some implementations, a planarization tool 110 may be used to planarize the dielectric layer 456 after the material of the dielectric layer 456 is deposited.

In some implementations, a pattern in a photoresist layer is used to etch the dielectric layer 456 to form the recesses. In these implementations, a deposition tool 102 may be used to form the photoresist layer on the dielectric layer 456. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the dielectric layer 456 based on the pattern to form the recesses in the dielectric layer 456. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the dielectric layer 456 based on a pattern.

A deposition tool 102 and/or a plating tool 112 may be used to deposit the material of the source/drain contacts 428*a* and 428*b*, the source/drain contacts 442*a* and 442*b*, the contact(s) 446, and/or the contact(s) 450 in the recesses using a CVD technique, a PVD technique, an ALD technique, an electroplating technique, another deposition technique described above in connection with FIG. 1, and/or another suitable deposition operation. In some implementations, a seed layer is first deposited, and the material of the source/drain contacts 428*a* and 428*b*, the source/drain contacts 442*a* and 442*b*, the contact(s) 446, and/or the contact(s) 450 is deposited on the seed layer. In some implementations, the planarization tool 110 may be used to planarize the source/drain contacts 428*a* and 428*b*, the source/drain contacts 442*a* and 442*b*, the contact(s) 446, and/or the contact(s) 450 after the source/drain contacts 428*a* and 428*b*, the source/drain contacts 442*a* and 442*b*, the contact(s) 446, and/or the contact(s) 450 are deposited.

As indicated above, FIGS. 6A-6F are provided as an example. Other examples may differ from what is described with regard to FIGS. 6A-6F.

FIGS. 7A-7E are diagrams of an example implementation 700 of forming a semiconductor device 500 described herein. In some implementations, one or more of the semiconductor processing operations described in connection with FIGS. 7A-7E may be performed using one or more of the semiconductor processing tools 102-114 and/or the wafer/die transport tool 116. In some implementations, one or more of the processing operations described in connection with FIGS. 7A-7E may be performed using another semiconductor processing tool not shown in FIG. 1. In some implementations, one or more of the processing operations described in connection with FIGS. 7A-7E are performed after one or more of the semiconductor processing operations, described in connection with FIGS. 6A-6F, for forming the memory structure 400 in the semiconductor device 500. Portions of the memory structure 400 are omitted from FIGS. 7A-7E for clarity.

Figure 7A:
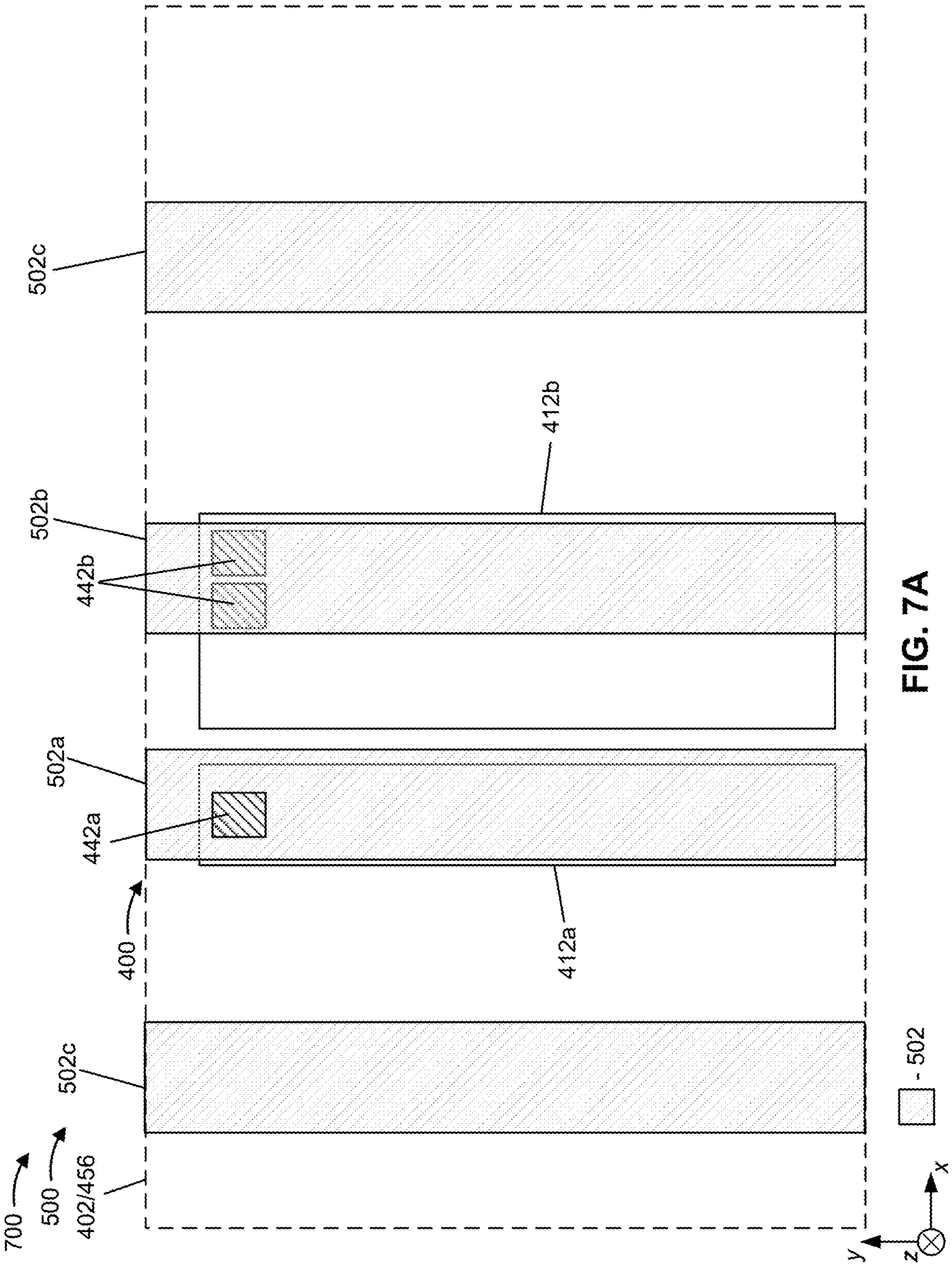
FIGS. 7A-7E are diagrams of an example implementation of forming a memory structure described herein.

As shown in FIG. 7A, the metal lines 502*a*-502*d* of the first metallization layer 502 are formed above the substrate 402 and above the memory structure 400 of the semiconductor device 500. The metal lines 502*a*-502*d* may be formed such that the metal lines 502*a*-502*d* extend in the y-direction in the semiconductor device 500.

The metal lines 502*a*-502*d* of the first metallization layer 502 may be formed in recesses in a dielectric layer (not shown) of an interconnect structure above the memory structure 400 in the semiconductor device 500. A deposition tool 102 may be used to deposit the dielectric layer using a PVD technique, an ALD technique, a CVD technique, an oxidation technique, another type of deposition operation technique in connection with FIG. 1, and/or another suitable deposition technique. In some implementations, a planarization tool 110 may be used to planarize the dielectric layer after the material of the dielectric layer is deposited.

In some implementations, a pattern in a photoresist layer is used to etch the dielectric layer to form the recesses. In these implementations, a deposition tool 102 may be used to form the photoresist layer on the dielectric layer. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the dielectric layer based on the pattern to form the recesses in the dielectric layer. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the dielectric layer based on a pattern.

A deposition tool 102 and/or a plating tool 112 may be used to deposit the metal lines 502*a*-502*d* of the first metallization layer 502 in the recesses using a CVD technique, a PVD technique, an ALD technique, an electroplating technique, another deposition technique described above in connection with FIG. 1, and/or another suitable deposition operation. In some implementations, a seed layer is first deposited, and the metal lines 502*a*-502*d* of the first metallization layer 502 are deposited on the seed layer. In some implementations, the planarization tool 110 may be used to planarize the metal lines 502*a*-502*d* of the first metallization layer 502 after the metal lines 502*a*-502*d* of the first metallization layer 502 are deposited.

Figure 7B:
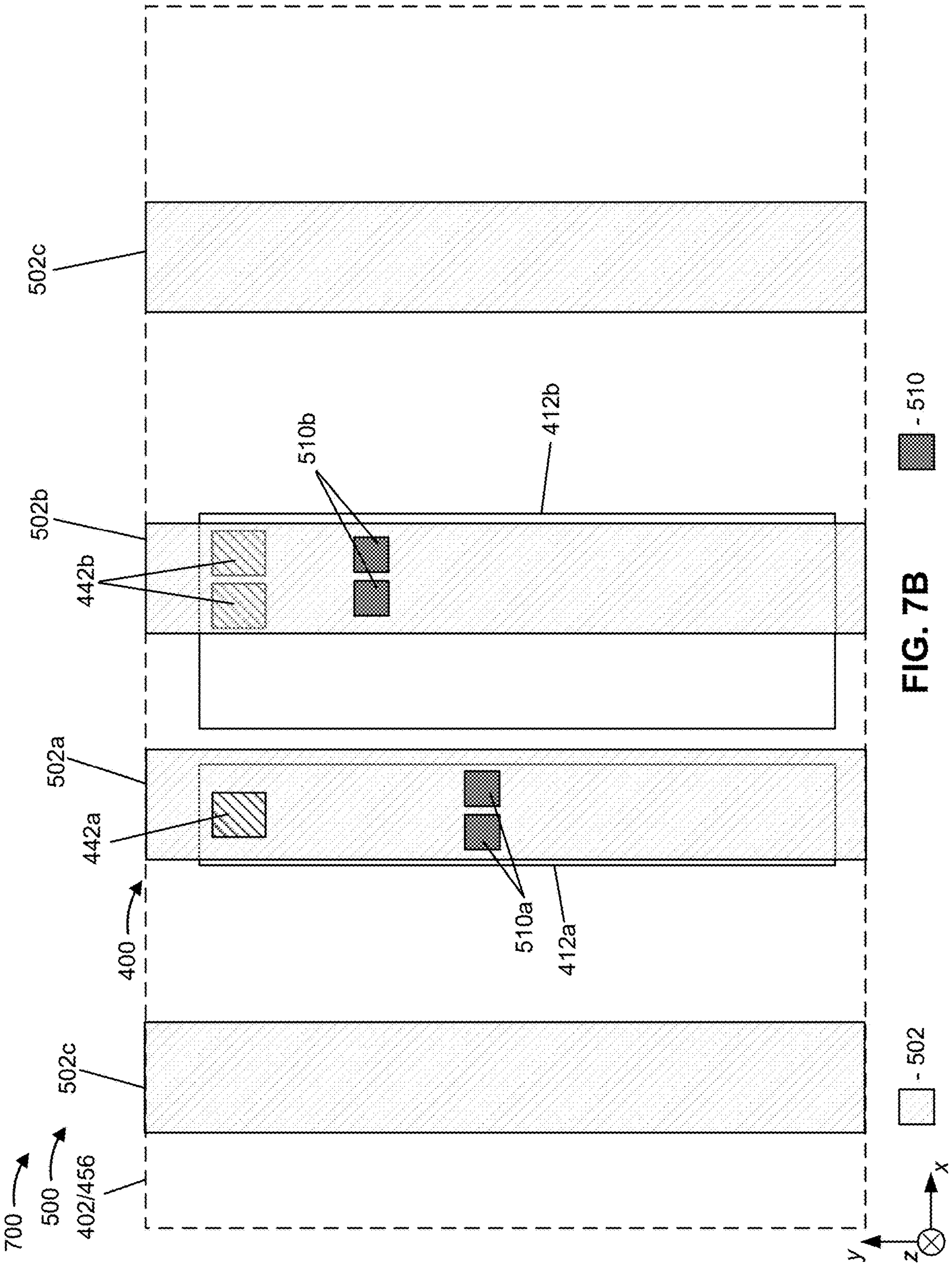

As shown in FIG. 7B, the interconnect structures 510 are formed on the first metallization layer 502. For example, the interconnect structures 510*a* may be formed on the metal line 502*a* of the first metallization layer 502 such that the interconnect structures 510*a* are formed above the write bit line active region 412*a*. As another example, the interconnect structures 510*b* may be formed on the metal line 502*b* of the first metallization layer 502 such that the interconnect structures 510*b* are formed above the read bit line active region 412*b*. The interconnect structures 510 may be formed such that the interconnect structures 510 extend in the z-direction in the semiconductor device 500.

The interconnect structures 510 may be formed in recesses in a dielectric layer (not shown) above the first metallization layer 502 in the interconnect structure of the semiconductor device 500. A deposition tool 102 may be used to deposit the dielectric layer using a PVD technique, an ALD technique, a CVD technique, an oxidation technique, another type of deposition operation technique in connection with FIG. 1, and/or another suitable deposition technique. In some implementations, a planarization tool 110 may be used to planarize the dielectric layer after the material of the dielectric layer is deposited.

In some implementations, a pattern in a photoresist layer is used to etch the dielectric layer to form the recesses. In these implementations, a deposition tool 102 may be used to form the photoresist layer on the dielectric layer. An exposure tool 104 may be used to expose the photoresist layer to a radiation source to pattern the photoresist layer. A developer tool 106 may to develop and remove portions of the photoresist layer to expose the pattern. An etch tool 108 may be used to etch the dielectric layer based on the pattern to form the recesses in the dielectric layer. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the dielectric layer based on a pattern.

A deposition tool 102 and/or a plating tool 112 may be used to deposit the interconnect structures 510 in the recesses using a CVD technique, a PVD technique, an ALD technique, an electroplating technique, another deposition technique described above in connection with FIG. 1, and/or another suitable deposition operation. In some implementations, a seed layer is first deposited, and the interconnect structures 510 are deposited on the seed layer. In some implementations, the planarization tool 110 may be used to planarize the interconnect structures 510 after the interconnect structures 510 are deposited.

Figure 7C:
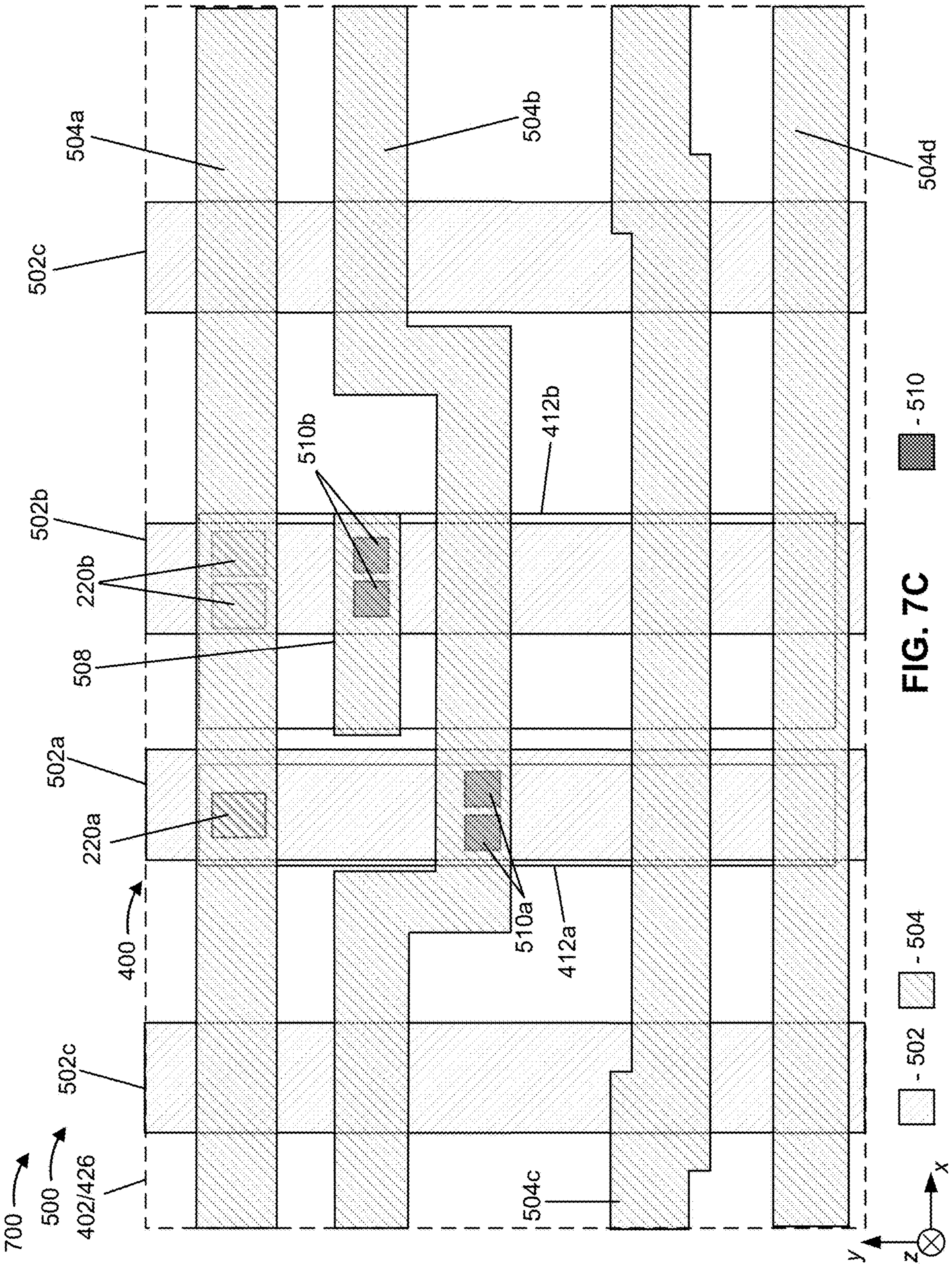

As shown in FIG. 7C, the metal lines 504*a*-504*d* and the connection pad structure 508 of the second metallization layer 504 are formed above the interconnect structures 510 in the interconnect structure of the semiconductor device 500. The metal lines 504*a*-504*d* and the connection pad structure 508 may be formed such that the metal lines 504*a*-504*d* and the connection pad structure 508 extend in the x-direction in the semiconductor device 500.

The metal lines 504*a*-504*d* and the connection pad structure 508 of the second metallization layer 504 may be formed in recesses in a dielectric layer (not shown) of an interconnect structure above the interconnect structures 510. A deposition tool 102 may be used to deposit the dielectric layer using a PVD technique, an ALD technique, a CVD technique, an oxidation technique, another type of deposition operation technique in connection with FIG. 1, and/or another suitable deposition technique. In some implementations, a planarization tool 110 may be used to planarize the dielectric layer after the material of the dielectric layer is deposited.

In some implementations, a pattern in a photoresist layer is used to etch the dielectric layer to form the recesses. In these implementations, a deposition tool 102 may be used to form the photoresist layer on the dielectric layer. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the dielectric layer based on the pattern to form the recesses in the dielectric layer. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the dielectric layer based on a pattern.

A deposition tool 102 and/or a plating tool 112 may be used to deposit the metal lines 504*a*-504*d* and the connection pad structure 508 of the second metallization layer 504 in the recesses using a CVD technique, a PVD technique, an ALD technique, an electroplating technique, another deposition technique described above in connection with FIG. 1, and/or another suitable deposition operation. In some implementations, a seed layer is first deposited, and the metal lines 504*a*-504*d* and the connection pad structure 508 of the second metallization layer 504 are deposited on the seed layer. In some implementations, the planarization tool 110 may be used to planarize the metal lines 504*a*-504*d* and the connection pad structure 508 of the second metallization layer 504 after the metal lines 504*a*-504*d* and the connection pad structure 508 of the second metallization layer 504 are deposited.

The metal line 504*b* may be formed such that the metal line 504*b* includes the segments 514*a*-514*e*. Moreover, the metal line 504*b* (e.g., the write bit line metallization layer of the memory structure 400) may be formed such that the metal line 504*b* is physically coupled and/or electrically coupled with the interconnect structures 510*a*. The connection pad structure 508 may be formed such that the connection pad structure 508 is physically coupled and/or electrically coupled with the interconnect structures 510*b*.

Figure 7D:
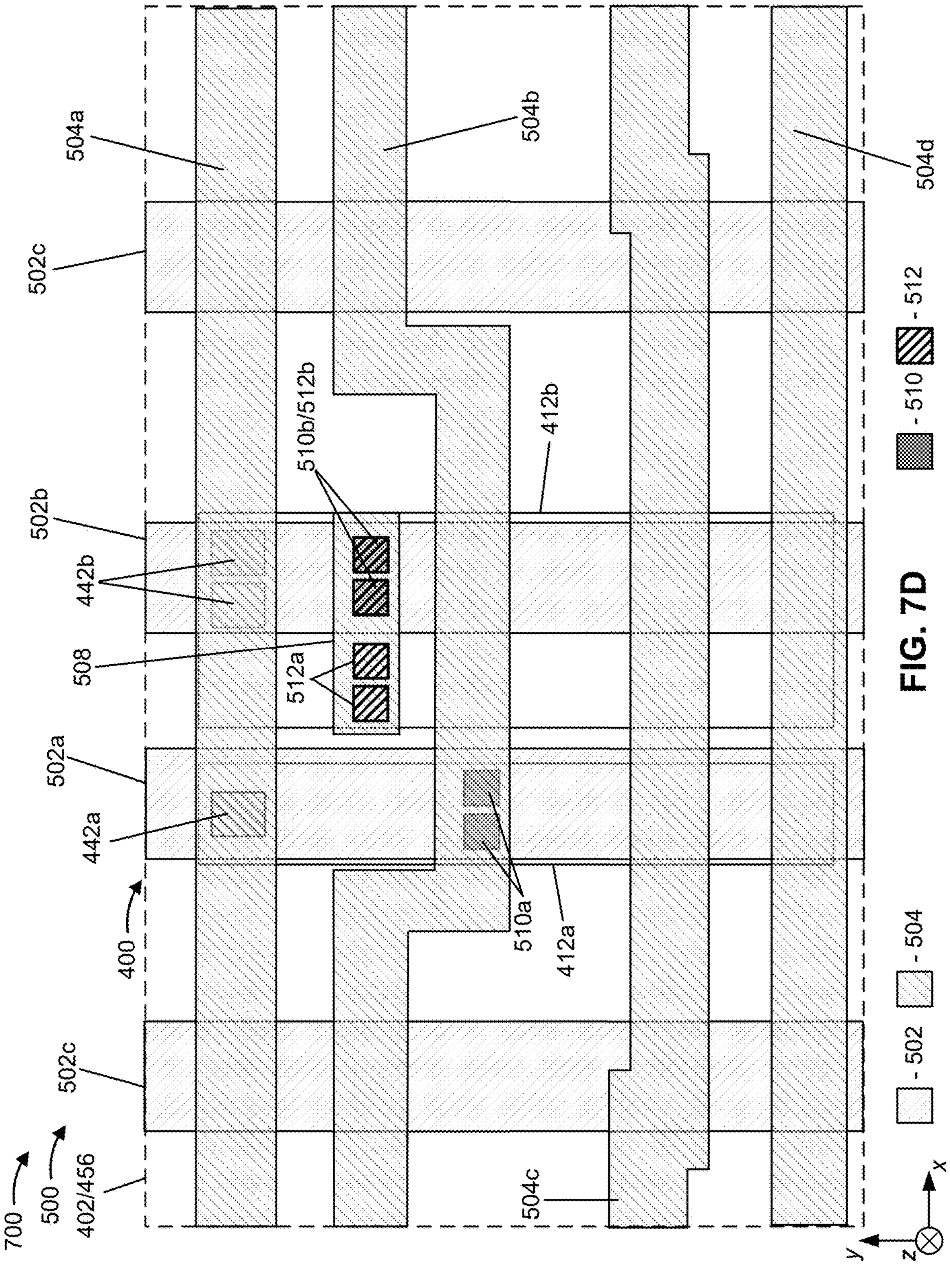

As shown in FIG. 7D, the interconnect structures 512 are formed on the second metallization layer 504. For example, the interconnect structures 512*a* and 512*b* may be formed on the connection pad structure 508 of the second metallization layer 504. The interconnect structures 512 may be formed such that the interconnect structures 512 extend in the z-direction in the semiconductor device 500.

The interconnect structures 512 may be formed in recesses in a dielectric layer (not shown) above the second metallization layer 504 in the interconnect structure of the semiconductor device 500. A deposition tool 102 may be used to deposit the dielectric layer using a PVD technique, an ALD technique, a CVD technique, an oxidation technique, another type of deposition operation technique in connection with FIG. 1, and/or another suitable deposition technique. In some implementations, a planarization tool 110 may be used to planarize the dielectric layer after the material of the dielectric layer is deposited.

In some implementations, a pattern in a photoresist layer is used to etch the dielectric layer to form the recesses. In these implementations, a deposition tool 102 may be used to form the photoresist layer on the dielectric layer. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the dielectric layer based on the pattern to form the recesses in the dielectric layer. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the dielectric layer based on a pattern.

A deposition tool 102 and/or a plating tool 112 may be used to deposit the interconnect structures 512 in the recesses using a CVD technique, a PVD technique, an ALD technique, an electroplating technique, another deposition technique described above in connection with FIG. 1, and/or another suitable deposition operation. In some implementations, a seed layer is first deposited, and the interconnect structures 512 are deposited on the seed layer. In some implementations, the planarization tool 110 may be used to planarize the metal lines interconnect structures 512 after the interconnect structures 512 are deposited.

Figure 7E:
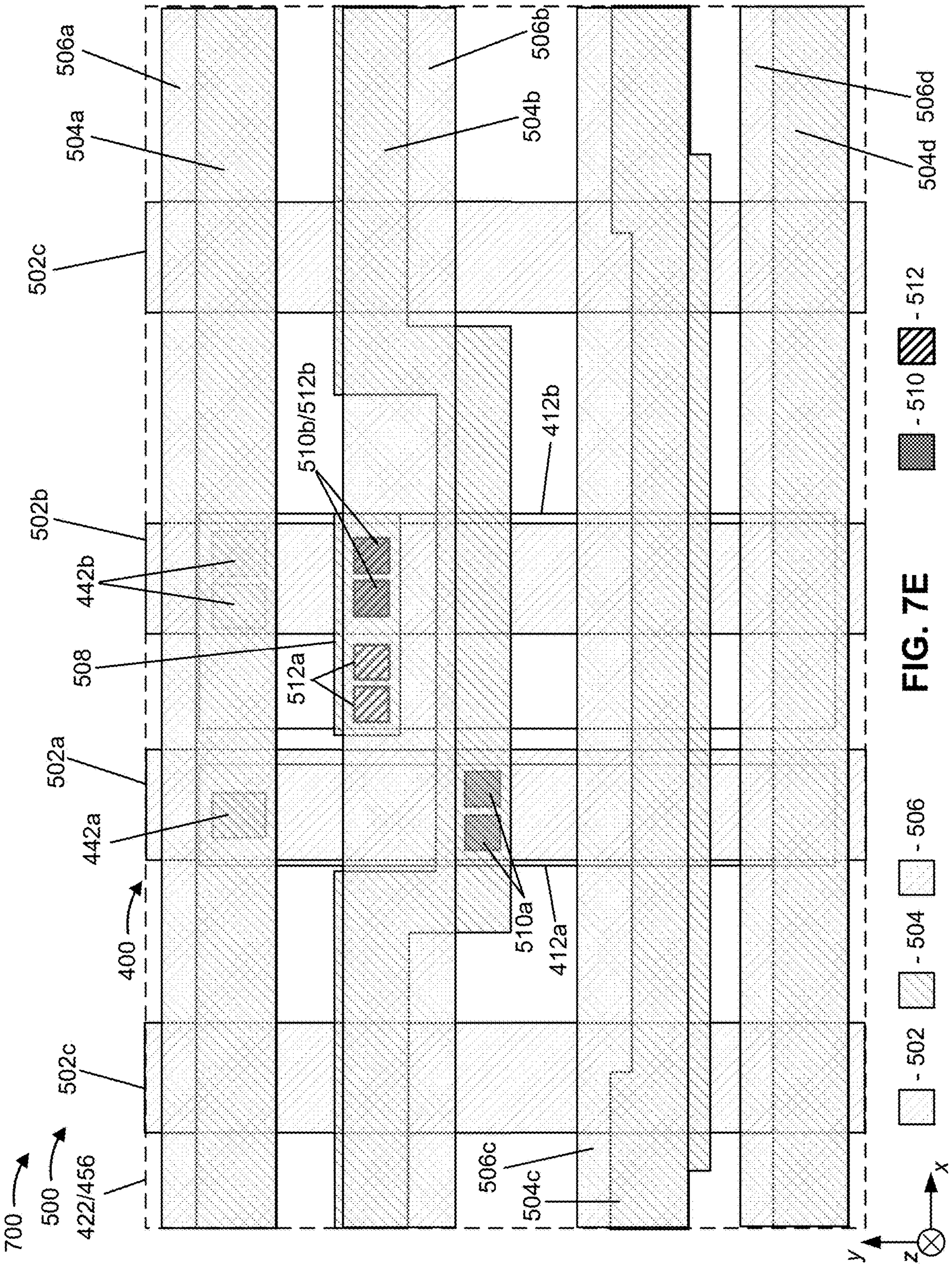

As shown in FIG. 7E, the metal lines 506*a*-506*d* of the third metallization layer 506 are formed above the interconnect structures 512 in the interconnect structure of the semiconductor device 500. The metal lines 506*a*-506*d* of the third metallization layer 506 may be formed such that the metal lines 506*a*-506*d* of the third metallization layer 506 extend in the x-direction in the semiconductor device 500.

The metal lines 506*a*-506*d* of the third metallization layer 506 may be formed in recesses in a dielectric layer (not shown) of an interconnect structure above the interconnect structures 512. A deposition tool 102 may be used to deposit the dielectric layer using a PVD technique, an ALD technique, a CVD technique, an oxidation technique, another type of deposition operation technique in connection with FIG. 1, and/or another suitable deposition technique. In some implementations, a planarization tool 110 may be used to planarize the dielectric layer after the material of the dielectric layer is deposited.

In some implementations, a pattern in a photoresist layer is used to etch the dielectric layer to form the recesses. In these implementations, a deposition tool 102 may be used to form the photoresist layer on the dielectric layer. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the dielectric layer based on the pattern to form the recesses in the dielectric layer. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the dielectric layer based on a pattern.

A deposition tool 102 and/or a plating tool 112 may be used to deposit the metal lines 506*a*-506*d* of the third metallization layer 506 in the recesses using a CVD technique, a PVD technique, an ALD technique, an electroplating technique, another deposition technique described above in connection with FIG. 1, and/or another suitable deposition operation. In some implementations, a seed layer is first deposited, and the metal lines 506*a*-506*d* of the third metallization layer 506 are deposited on the seed layer. In some implementations, the planarization tool 110 may be used to planarize the metal lines 506*a*-506*d* of the third metallization layer 506 after the metal lines 506*a*-506*d* of the third metallization layer 506 are deposited.

The metal line 506*b* may be formed such that the metal line 506*b* is formed above the connection pad structure 508. Moreover, the metal line 506*b* (e.g., the read bit line metallization layer) may be formed such that the metal line 506*b* is physically coupled and/or electrically coupled with the interconnect structures 512*a* and 512*b*.

As indicated above, FIGS. 7A-7E are provided as an example. Other examples may differ from what is described with regard to FIGS. 7A-7E.

Figure 8:
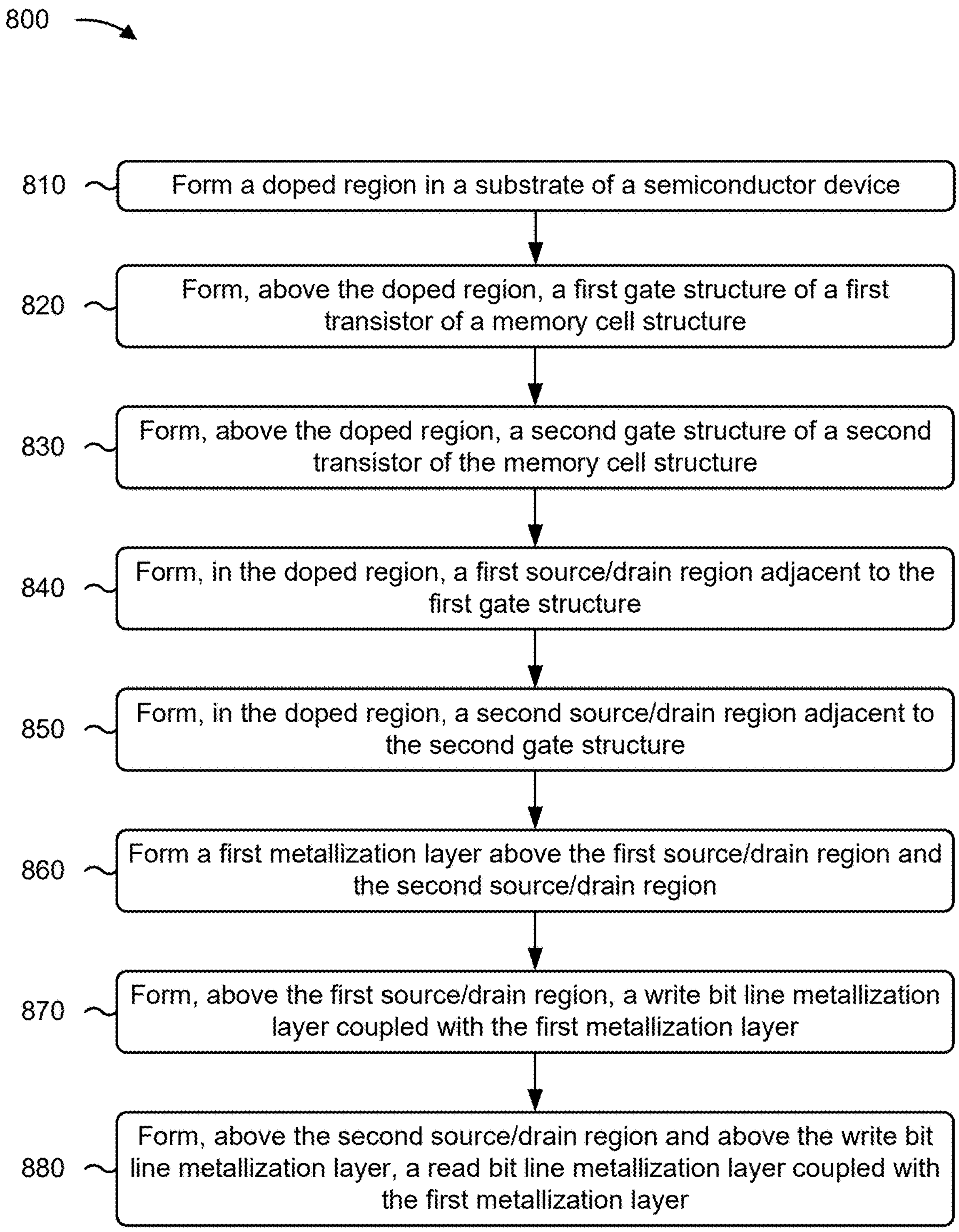
FIG. 8 is a flowchart of an example process associated with forming a semiconductor device including a memory structure described herein.

FIG. 8 is a flowchart of an example process 800 associated with forming a semiconductor device including a memory structure described herein. In some implementations, one or more process blocks of FIG. 8 are performed using one or more semiconductor processing tools (e.g., one or more of the semiconductor processing tools 102-114).

As shown in FIG. 8, process 800 may include forming a doped region in a substrate of a semiconductor device (block 810). For example, one or more of the semiconductor processing tools 102-114 may be used to form a doped region (e.g., a well region 406) in a substrate 402 of a semiconductor device 500, as described herein.

As further shown in FIG. 8, process 800 may include forming, above the doped region, a first gate structure of a first transistor of a memory structure (block 820). For example, one or more of the semiconductor processing tools 102-114 may be used to form, above the doped region, a first gate structure (e.g., a first floating gate structure 432*a*) of a first transistor (e.g., a first storage transistor structure 440*a*) of a memory structure 400, as described herein.

As further shown in FIG. 8, process 800 may include forming, above the doped region, a second gate structure of a second transistor of the memory structure (block 830). For example, one or more of the semiconductor processing tools 102-114 may be used to form, above the doped region, a second gate structure (e.g., a second floating gate structure 432*b*) of a second transistor (e.g., a second storage transistor structure 440*b*) of the memory structure 400, as described herein.

As further shown in FIG. 8, process 800 may include forming, in the doped region, a first source/drain region adjacent to the first gate structure (block 840). For example, one or more of the semiconductor processing tools 102-114 may be used to form, in the doped region, a first source/drain region (e.g., a storage source/drain region 438*a*) adjacent to the first gate structure, as described herein.

As further shown in FIG. 8, process 800 may include forming, in the doped region, a second source/drain region adjacent to the second gate structure (block 850). For example, one or more of the semiconductor processing tools 102-114 may be used to form, in the doped region, a second source/drain region (e.g., a storage source/drain region 438*b*) adjacent to the second gate structure, as described herein.

As further shown in FIG. 8, process 800 may include forming a first metallization layer (above the first source/drain region and the second source/drain region (block 860). For example, one or more of the semiconductor processing tools 102-114 may be used to form a first metallization layer (e.g., one or more of the metal lines 502*a*-502*d* of the first metallization layer 502) above the first source/drain region and the second source/drain region, as described herein.

As further shown in FIG. 8, process 800 may include forming, above the first source/drain region, a write bit line metallization layer coupled with the first metallization layer (block 870). For example, one or more of the semiconductor processing tools 102-114 may be used to form, above the first source/drain region, a write bit line metallization layer (e.g., one or more of the metal lines 504*a*-504*d* of the second metallization layer 504) coupled with the first metallization layer, as described herein.

As further shown in FIG. 8, process 800 may include forming, above the second source/drain region and above the write bit line metallization layer, a read bit line metallization layer coupled with the first metallization layer (block 880). For example, one or more of the semiconductor processing tools 102-114 may be used to form, above the second source/drain region and above the write bit line metallization layer, a read bit line metallization layer (e.g., one or more of the metal lines 506*a*-506*d* of the third metallization layer 506) coupled with the first metallization layer, as described herein.

Process 800 may include additional implementations, such as any single implementation or any combination of implementations described below and/or in connection with one or more other processes described elsewhere herein.

In a first implementation, forming the first metallization layer includes forming a first metal line (e.g., a metal line 502*a*), of the first metallization layer, above the first source/drain region, and forming a second metal line (e.g., a metal line 502*b*), of the first metallization layer, above the second source/drain region, where forming the write bit line metallization layer includes forming the write bit line metallization layer coupled with the first metal line, and where forming the read bit line metallization layer includes forming the read bit line metallization layer coupled with the second metal line.

In a second implementation, alone or in combination with the first implementation, process 800 includes forming one or more first interconnect structures (e.g., interconnect structures 510*a*) above the first metal line, forming one or more second interconnect structures (e.g., interconnect structures 510*b*) above the second metal line, and forming a connection pad structure 508 over the one or more second interconnect structures, where forming the write bit line metallization layer includes forming the write bit line metallization layer over the one or more first interconnect structures, and where forming the read bit line metallization layer includes forming the read bit line metallization layer above the connection pad structure 508.

In a third implementation, alone or in combination with one or more of the first and second implementations, process 800 includes forming one or more third interconnect structures (e.g., interconnect structures 512*a*, interconnect structures 512*b*) above the connection pad structure 508, where forming the read bit line metallization layer includes forming the read bit line metallization layer above the one or more third interconnect structures.

In a fourth implementation, alone or in combination with one or more of the first through third implementations, forming the read bit line metallization layer includes forming the read bit line metallization layer to a thickness (e.g., the dimension D8) that is greater than a thickness (e.g., the dimension D7) of the write bit line metallization layer.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

In this way, a semiconductor device includes a non-volatile memory structure such as an MTP memory cell. A layout of metallization layers of semiconductor device coupled with the non-volatile memory structure is configured to achieve a low likelihood of electromigration in the non-volatile memory structure, particularly at operating temperature parameters associated with demanding applications such as automotive and/or industrial, among other examples. The non-volatile memory structure is electrically coupled with a first metallization layer (e.g., an M1 layer). The first metallization layer electrically couples the non-volatile memory structure with a second metallization layer (e.g., an M2 layer) that is configured as a write bit line for the non-volatile memory structure. The first metallization layer electrically couples the non-volatile memory structure with a third metallization layer (e.g., an M3 layer) above the second metallization layer. The third metallization layer is configured as a read bit line (for the non-volatile memory structure. The greater top view width of the third metallization layer enables the third metallization layer to better handle a cell read current of the non-volatile memory structure (which is greater than a cell write current of the non-volatile memory structure) than the second metallization layer. In particular, the greater top view width of the third metallization layer enables the third metallization layer to withstand electromigration at greater operating currents because of the greater heat dissipation in the third metallization layer than in the second metallization layer.

As described in greater detail above, some implementations described herein provide a semiconductor device. The semiconductor device includes a memory structure. The semiconductor device includes a first metallization layer coupled with the memory structure. The semiconductor device includes a second metallization layer, above the first metallization layer, coupled with the memory structure through the first metallization layer, where the second metallization layer is a write bit line metallization layer of the memory structure. The semiconductor device includes a third metallization layer, above the second metallization layer, coupled with the memory structure through the first metallization layer, where the third metallization layer is a read bit line of the memory structure.

As described in greater detail above, some implementations described herein provide a semiconductor device. The semiconductor device includes a memory structure. The semiconductor device includes a first metallization layer coupled with the memory structure. The semiconductor device includes a second metallization layer, above the first metallization layer, comprising, a first metal line, configured as a write bit line metallization layer of the memory structure, coupled with the first metallization layer through one or more first interconnect structures a connection pad structure, spaced apart from the first metal line, coupled with the first metallization layer through one or more second interconnect structures. The semiconductor device includes a third metallization layer, above the second metallization layer, comprising, a second metal line configured as a read bit line of the memory structure, where the second metal line is coupled with the first metallization layer through the connection pad structure.

As described in greater detail above, some implementations described herein provide a method. The method includes forming a doped region in a substrate of a semiconductor device. The method includes forming, above the doped region, a first gate structure of a first transistor of a memory structure. The method includes forming, above the doped region, a second gate structure of a second transistor of the memory structure. The method includes forming, in the doped region, a first source/drain region adjacent to the first gate structure. The method includes forming, in the doped region, a second source/drain region adjacent to the second gate structure. The method includes forming a first metallization layer above the first source/drain region and the second source/drain region. The method includes forming, above the first source/drain region, a write bit line metallization layer coupled with the first metallization layer. The method includes forming, above the second source/drain region and above the write bit line metallization layer, a read bit line metallization layer coupled with the first metallization layer.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The terms "approximately" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "approximately" and "substantially" can refer to a percentage of the values of a given quantity in light of this disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a memory structure;
a first metallization layer coupled with the memory structure;
a second metallization layer, above the first metallization layer, coupled with the memory structure through the first metallization layer,
wherein the second metallization layer is a write bit line metallization layer of the memory structure; and
a third metallization layer, above the second metallization layer, coupled with the memory structure through the first metallization layer,
wherein the third metallization layer is a read bit line of the memory structure.

2. The semiconductor device of claim 1, wherein the second metallization layer is coupled with a first source/drain region of a first storage transistor structure of the memory structure; and
wherein the third metallization layer is coupled with a second source/drain region of a second storage transistor structure of the memory structure.

3. The semiconductor device of claim 1, wherein a top view width of the third metallization layer is greater than a top view width of the second metallization layer.

4. The semiconductor device of claim 3, wherein the top view width of the third metallization layer is included in a range of approximately 0.25 microns to approximately 0.65 microns.

5. The semiconductor device of claim 1, wherein a top view distance between a first metal line of the third metallization layer and a second metal line of the third metallization layer is included in a range of approximately 0.25 microns to approximately 0.5 microns.

6. The semiconductor device of claim 1, wherein a first top view distance between a first metal line of the third metallization layer and a second metal line of the third metallization layer is greater than a second top view distance between a third metal line of the second metallization layer and a fourth metal line of the second metallization layer.

7. A semiconductor device, comprising:
a memory structure;
a first metallization layer coupled with the memory structure;
a second metallization layer, above the first metallization layer, comprising:
a first metal line, configured as a write bit line metallization layer of the memory structure, coupled with the first metallization layer through one or more first interconnect structures; and
a connection pad structure, spaced apart from the first metal line, coupled with the first metallization layer through one or more second interconnect structures; and
a third metallization layer, above the second metallization layer, comprising:
a second metal line configured as a read bit line metallization layer of the memory structure,
wherein the second metal line is coupled with the first metallization layer through the connection pad structure.

8. The semiconductor device of claim 7, wherein the second metal line is coupled with the first metallization layer through the one or more second interconnect structures and through one or more third interconnect structures between the connection pad structure and the second metal line.

9. The semiconductor device of claim 8, wherein a quantity of the one or more third interconnect structures is greater than a quantity of the one or more second interconnect structures.

10. The semiconductor device of claim 7, wherein the first metal line comprises:
a first segment adjacent to a first end of the connection pad structure in a top view of the semiconductor device;
a second segment adjacent to a second end of the connection pad structure opposing the first end in the top view of the semiconductor device; and
a third segment adjacent to a side of the connection pad structure in the top view of the semiconductor device,
wherein the first segment, the second segment, and the third segment are approximately parallel in the top view of the semiconductor device, and
wherein the one or more first interconnect structures are coupled with the third segment.

11. The semiconductor device of claim 10, wherein the third segment is offset from the first segment and the second segment in the top view of the semiconductor device; and
wherein the second metal line overlaps the first segment and the second segment in the top view of the semiconductor device.

12. The semiconductor device of claim 10, wherein a portion of the third segment, that is coupled with the one or more first interconnect structures, extends laterally outward from the second metal line.

13. The semiconductor device of claim 10, wherein the first metal line comprises:
a fourth segment between the first segment and the third segment; and
a fifth segment between the second segment and the third segment,
wherein the second metal line overlaps the fourth segment and the fifth segment.

14. The semiconductor device of claim 13, wherein the fourth segment and the fifth segment are approximately parallel in the top view of the semiconductor device; and
wherein the first segment, the second segment, and the third segment are approximately perpendicular to the fourth segment and the fifth segment in the top view of the semiconductor device.

15. The semiconductor device of claim 7, wherein a top view width of the third metallization layer is greater than a top view width of the second metallization layer; and
wherein a first top view distance between a first metal line of the third metallization layer and a second metal line of the third metallization layer is greater than a top view distance between a the first metal line of the second metallization layer and a the second metal line of the second metallization layer.

16. A method, comprising:
forming a doped region in a substrate of a semiconductor device;
forming, above the doped region, a first gate structure of a first transistor structure of a memory structure;
forming, above the doped region, a second gate structure of a second transistor structure of the memory structure;
forming, in the doped region, a first source/drain region adjacent to the first gate structure;
forming, in the doped region, a second source/drain region adjacent to the second gate structure;

forming a first metallization layer above the first source/drain region and the second source/drain region;

forming, above the first source/drain region, a write bit line metallization layer coupled with the first metallization layer; and forming, above the second source/drain region and above the write bit line metallization layer, a read bit line metallization layer coupled with the first metallization layer.

17. The method of claim 16, wherein forming the first metallization layer comprises:

forming a first metal line, of the first metallization layer, above the first source/drain region; and forming a second metal line, of the first metallization layer, above the second source/drain region;

wherein forming the write bit line metallization layer comprises:

forming the write bit line metallization layer coupled with the first metal line; and wherein forming the read bit line metallization layer comprises:

forming the read bit line metallization layer coupled with the second metal line.

18. The method of claim 17, further comprising:

forming one or more first interconnect structures above the first metal line;

forming one or more second interconnect structures above the second metal line; and forming a connection pad structure over the one or more second interconnect structures, wherein forming the write bit line metallization layer comprises:

forming the write bit line metallization layer over the one or more first interconnect structures, and wherein forming the read bit line metallization layer comprises:

forming the read bit line metallization layer above the connection pad structure.

19. The method of claim 18, further comprising:

forming one or more third interconnect structures above the connection pad structure, wherein forming the read bit line metallization layer comprises:

forming the read bit line metallization layer above the one or more third interconnect structures.

20. The method of claim 16, wherein forming the read bit line metallization layer comprises:

forming the read bit line metallization layer to a thickness that is greater than a thickness of the write bit line metallization layer.

* * * * *